United States Patent [19]
Kinoshita et al.

[11] Patent Number: 5,574,729
[45] Date of Patent: Nov. 12, 1996

[54] REDUNDANCY CIRCUIT FOR REPAIRING DEFECTIVE BITS IN SEMICONDUCTOR MEMORY DEVICE

[75] Inventors: Mitsuya Kinoshita; Shigeru Mori; Yoshikazu Morooka; Hiroshi Miyamoto; Shigeru Kikuda; Makoto Suwa, all of Hyogo-ken, Japan

[73] Assignee: Mitsubishi Denki Kabushiki Kaisha, Tokyo, Japan

[21] Appl. No.: 338,817

[22] Filed: Nov. 10, 1994

Related U.S. Application Data

[63] Continuation of Ser. No. 766,177, Sep. 27, 1991, abandoned.

[30] Foreign Application Priority Data

Sep. 29, 1990 [JP] Japan ................... 2-261213

[51] Int. Cl.$^6$ ................................. G06F 11/00
[52] U.S. Cl. .............. 371/10.3; 371/10.2; 365/200
[58] Field of Search ................. 371/10.3, 10.1, 371/10.2, 8.1, 7, 21.1; 395/575, 182.04; 365/200, 201

[56] References Cited

U.S. PATENT DOCUMENTS

| | | | |
|---|---|---|---|
| 4,365,319 | 12/1982 | Takemae | 365/200 |
| 4,849,938 | 7/1989 | Furutani et al. | 371/10 |
| 5,083,294 | 1/1992 | Okajima | 365/200 |
| 5,134,585 | 7/1992 | Murakami et al. | 371/10.3 |
| 5,227,999 | 7/1993 | Ihara et al. | 365/200 |

FOREIGN PATENT DOCUMENTS

| | | |
|---|---|---|
| 61-61300 | 3/1986 | Japan. |
| 61-35636 | 8/1986 | Japan. |
| 64-27099 | 1/1989 | Japan. |
| 62-183159 | 1/1989 | Japan. |

OTHER PUBLICATIONS

"A 7NS 1MB BiCMOS ECL SRAM with Program–Free Redundancy" Ohba et al, CH2885–Feb. 1990 IEEE pp. 41–42.

*Primary Examiner*—Robert W. Beausoliel, Jr.
*Assistant Examiner*—Phung My Chung
*Attorney, Agent, or Firm*—Lowe, Price, LeBlanc & Becker

[57] ABSTRACT

A semiconductor memory device includes a plurality of memory blocks, i main row or column select lines extending over the plurality of memory blocks, and a decoder for selecting one of the main row or column select lines in accordance with an applied address signal. The decoder includes i outputs. Each of the memory blocks includes a plurality of memory cells arranged in rows and columns and at least (i+1) sub row or column select lines each for selecting one row or one column of memory cells. A shift redundancy circuit is provided for each of the memory blocks, for connecting the main row or column select line and the sub row or column select line. The shift redundancy circuit includes a switch circuit for connecting one main row or column select line to one of the plurality of adjacent sub row or column select lines, and a circuit for setting a connection path of the switch circuit. The shift redundancy circuit connects successively adjacent sub row or column select lines to main row or column select lines in one to one correspondence except a defective sub row or column select line associated with a defective bit.

29 Claims, 19 Drawing Sheets

REDUNDANCY CIRCUIT FOR REPAIRING DEFECTIVE BITS IN SEMICONDUCTOR MEMORY DEVICE

This application is a continuation of application Ser. No. 07/766,177 filed Sep. 27, 1991 now abandoned.

BACKGROUND OF THE INVENTION

1. Field of the Invention

The invention relates to redundancy circuits for repairing a defective bit in a semiconductor memory device and, more particularly, relates to redundancy circuits for repairing a defective bit in a semiconductor memory device of a block dividing scheme.

2. Description of the Background Art

Generally, in a semiconductor memory device, spare rows and spare columns are provided for repairing a defective memory cell which does not function correctly (hereinafter referred to as defective bit) to increase the product yield.

FIG. 1 schematically shows a structure of a portion related to repairing of a defective bit in a conventional semiconductor memory device. The semiconductor memory device shown in the figure employs a column select line scheme and includes a shared sense amplifier structure. In the column select line scheme, when one column of memory cells arranged in an array of rows and columns is to be selected, the output (a column select signal) of a column decoder (column selecting means) is supplied to a column select line and a corresponding column of the memory cell array is connected to an internal data bus (IO line) with this column select line. In the shared sense amplifier structure, the memory cell array is divided into a plurality of blocks, the sense amplifier is provided to be shared by two blocks, and only one of the two blocks is selected tp be connected to the sense amplifier. The other block is maintained in a standby state (precharge state).

Referring to FIG. 1, the semiconductor memory device has a memory cell array 1 including a plurality of memory cells (not shown). The memory cell array 1 is divided into four memory cell blocks A, B, C and D. Each of the memory cell blocks A to D includes two subarrays 6a and 6b. Each of subarrays 6a and 6b has a plurality of memory cells arranged in a matrix including rows and columns though they are not specifically shown here.

The semiconductor memory device further includes a column decoder 3 for decoding internal column address signals $A_0$ to $A_n$ from an address buffer (not shown) and generating column select signals and a column select line 40 for transmitting the column select signal from column decoder 3. Column select line 40 is provided for each of the outputs of column decoder 3 and runs over the four memory blocks A to D. Since the one column select line 40 is shared by four memory blocks A to D, the same column select signal is transmitted to each of memory cell blocks A to D.

The memory cell array 1 includes a spare column forming region 12 for repairing a column to which a defective bit is connected. Spare column forming region 12 is provided corresponding to each of subarrays 6a and 6b of memory cell blocks A to D. Spare column forming region 12 includes a word line WL extending from a corresponding subarray (6a or 6b) and a spare column select line 13 disposed to be shared by spare column forming region 12 for respective four memory cell blocks A to D. Spare column select line 13 selects a spare column (to which memory cells of one column are connected) formed in region 12. A spare column select signal is supplied to spare column select line 13 from column decoder 3 regardless that the spare column is selected or not.

A description will be made in the following supposing that one memory block includes subblocks 6a, 6b and the spare column forming region 12. The memory blocks A to D include (sense amplifier+I/O) blocks 2a, 2b, 2c, 2d formed between subarrays 6a and 6b, respectively. Each of (sense amplifier+I/O) blocks 2a to 2d is shared by the two subarrays 6a and 6b arranged on either side thereof. Blocks 2a to 2d include normal I/O line pairs 8a to 8d for transmitting read out data from a normal column (bit line pair) and spare I/O buses 9a to 9d for transmitting read out data from the spare column, respectively.

Detailed structures of (sense amplifier+I/O) blocks 2a to 2d are shown in FIGS. 2 and 3. FIG. 2 shows the detailed structure of a portion related to a normal column of (sense amplifier+I/O) block 2 (the reference number 2 is used for representatively indicating blocks 2a to 2d). The structure shown in FIG. 2 corresponds to a region 100 of FIG. 1.

Referring to FIG. 2, the portion related to the normal column of block 2 includes a sense amplifier circuit SA for differentially amplifying the potentials of the nodes N1 and N2, I/O gates Q5, Q6 formed of n channel MOS transistors, responsive to a column select signal on column select signal line 40 for connecting the nodes N1 and N2 to a normal I/O line pair 8, array selection gates Q1 and Q2 formed of n channel MOS transistors, responsive to a subarray select signal SL for connecting a bit line pair BLL, $\overline{BLL}$ of subarray 6a to sense amplifier nodes N1 and N2, respectively, and array selection gates Q3 and Q4 formed of n channel MOS transistors, responsive to a subarray select signal SR for connecting a bit line pair BLR,$\overline{BLR}$ of subarray 6b to sense amplifier nodes N1 and N2.

One column of the subarray has a pair of bit lines BLL, $\overline{BLL}$ or BLR, $\overline{BLR}$. A memory cell MC is provided at a crossing of one word line WLL or WLR and one bit line of the bit line pair BLL, $\overline{BLL}$ or BLR, $\overline{BLR}$. In FIG. 2, memory cells MC are provided at a crossing of word line WLL and bit line BLL and at a crossing of word line WLR and bit line BLR.

The subarray select signals SL, SR are generated in response to an address signal of one bit (for example, a most significant row address signal) and only one of them becomes active in operation.

A detailed structure of a portion related to the spare column of the (sense amplifier+I/O) block is shown in FIG. 3. The structure shown in FIG. 3 corresponds to a region 110 of FIG. 1. Referring to FIGS. 3, the spare column also includes a bit line pair SBLL, $\overline{SBLL}$ or SBLR, $\overline{SBLR}$. The portion of block 2 related to the spare column includes a sense amplifier circuit SA for differentially amplifying the potentials of nodes N3 and N4, spare subarray selection gates Q7 and Q8 formed of n channel MOS transistors, responsive to a subarray select signal SL for connecting spare bit line pair SBLL, $\overline{SBLL}$ to sense amplifier nodes N3 and N4, spare subarray selection gates Q9 and Q10 formed of n channel MOS transistors, responsive to a subarray select signal SR for connecting spare bit line pair SBLR, $\overline{SBLR}$ to sense amplifier nodes N3 and N4, and spare I/O gates Q11 and Q12 formed of n channel MOS transistors, responsive to a spare column select signal on spare column select signal line 13 for connecting sense amplifier nodes N3 and N4 to a spare I/O line pair 9.

Referring back to FIG. 1, the semiconductor memory device includes fuse program circuits 10a to 10d provided corresponding to blocks A to D for determining if an address of a column including a defective bit in the related block (hereinafter referred to as defective column) is designated or not, and selection circuits 11a to 11d provided corresponding to blocks A to D, responsive to switching control signals φA to φD from the related fuse program circuit 10 (circuit 10a to 10d are representatively indicated by the reference numeral 10) for selecting one of the normal I/O line pair and spare I/O line 9 to connect the same to an internal data bus 120.

Fuse program circuit 10, for example, includes laser blowable fuse elements. An address of a defective bit (spare address) in an associated block is programmed by blowing off the fuse elements. Fuse program circuit 10 also determines coincidence/non coincidence between input address signals $A_0$ to $A_n$ and the programmed spare address and generates switching control signals φA to φD indicating the result of the determination.

The semiconductor memory device further includes an output circuit 7a for amplifying data on an internal data bus 120 and generating external output data Q and an input circuit 7b for generating internal write data and transmitting the same to internal data bus 120 in accordance with external input data D. The operation thereof will now be described with reference to FIG. 4 which is a timing diagram of the operation.

Now let us assume that subarray 6a includes a word line which is active, that is, selected.

In the standby state, the subarray select signals SL, SR are both at "H", and bit line pairs BLL, $\overline{BLL}$, BLR, $\overline{BLR}$, SBLL, $\overline{SBLL}$, SBLR, $\overline{SBLR}$ of each of blocks A to D are connected to sense amplifier nodes N1, N2, N3, N4 and precharged to an intermediate potential (for example, $V_{cc}/2$, $V_{cc}$: a power supply voltage level corresponding to "H").

When a row address signal is externally applied, subarray select signal SR rises to "L" at time t1 in accordance with this row address signal, gates Q3, Q4 and Q9, Q10 are turned off and subarray 6b and spare column region 12b are disconnected from sense amplifier nodes N1, N2 and N3, N4. Signal SL is at "H" and subarray 6a including the selected word line and spare column region 12a are connected to sense amplifier circuit of the block 2.

At time t2, the input row address signal is decoded in a decoder (not shown) and a corresponding word line WL is selected. Data of the memory cells connected to the selected word line are supplied to a corresponding bit line (BLL, $\overline{BLL}$, SBLL, $\overline{SBLL}$) in response to the word line selection. In FIG. 4, there is shown a case in which data of "H" is read out. In each bit line pair, the other bit line holds a precharge potential and a potential difference corresponding to the memory cell data read out is developed between the bit lines of each bit line pair.

At time t3, the sense amplifier circuit SA is activated and amplifies the bit line potential which has been supplied to nodes N1, N2 and N3, N4. At time t4, when the potential differences between the normal bit line pair BLL, $\overline{BLL}$ and between spare bit line pair SBLL, $\overline{SBLL}$ become sufficiently large by the sensing operation, column decoder 3 decodes supplied internal column address signals $A_0$ to $A_3$ and supplies a column select signal to corresponding column select line 40. At this time, a spare column select signal is also simultaneously supplied to spare column select signal line 13 from column decoder 3.

As a result, normal I/O line pair 8 is connected to selected normal bit line pair BLL, $\overline{BLL}$ and spare I/O line pair 9 is connected to spare bit line pair SBLL, $\overline{SBLL}$. The potentials of normal I/O line pair 8 and spare I/O line pair 9 are changed from precharge potentials ("H") to levels corresponding to the signal potentials of the corresponding bit line pairs.

An address indicating a defective column (spare address) is programmed in fuse program circuit 10 in advance by blowing off a fuse. The fuse program circuit 10 compares input column address signals $A_0$ to $A_n$ with the programmed spare address and generates control signals φA to φD according to the result of the comparison. Selection circuits 11a to 11d select normal I/O line pairs 8a to 8d when the corresponding control signals φA to φD indicate a non-coincidence. When they indicate a coincidence, spare I/O line pairs 9a to 9d are selected.

At the time of reading data, output circuit 7a is activated to amplify selected memory cell data transmitted to internal data bus 120 and generate external output data Q. At the time of writing data, input circuit 7b is activated to generate internal write data from the external write data D and supply the same to internal data bus 120. The internal write data is supplied to the selected memory cell through selection circuits 11a to 11d and blocks 2a to 2d. Since blocks A to D operate in parallel, input/output of data of 4 bits is carried out.

This semiconductor memory device has a disadvantage as follows. As a test operation for detecting a defective bit, there has been proposed a method in which data of the same value is written into all the memory cells, then memory cell data is read out, and the read out data is checked. In such a test mode, in order to speed up the test, row simultaneously writing is carried out in which data is simultaneously written into a row of memory cells. Subsequently, memory cell data of one row is simultaneously read out and a determination is made as to whether there is a defective bit in this one row by gate processing such as an exclusive NOR or the like in another path. A determination may be made as to whether there is a defective bit or not according to the potential level of I/O line 8 when memory cells of one row are simultaneously connected to normal I/O line 8. When there is a defective bit, a column is specified by sequentially accessing this row. The column address of the specified defective bit is programmed in fuse program circuits 10a to 10d, so that repairing of the defecting bit is effected. After programming the spare address, a test in the row simultaneous writing is conducted again in order to verify whether the repairing of the defective bit has been actually carried out or not. At this time, as the defective column is connected to normal I/O line 8, the test data is also written into the defective bit. Therefore, when the memory cell data is read out, the defective bit data is also read, so that the checking for the read out data indicates that there is a defective bit, making it impossible to determine if repairing of the defective bit has been certainly effected.

There is a test mode called a line mode test. In this test mode, data written in a memory cell of a column associated with a latch provided in each column is latched. Data in memory cells of one row is simultaneously read out and compared with data within a corresponding latch. Gate processing such as wired-AND processing is carried out for the result of the comparison of memory cells of one row, and a flag is produced indicating if there is a defective bit in the one row of memory cells. In this line mode test as well, the flag is generated reflecting the data of the defective bit, so that it is impossible to determine if the defective bit has been certainly repaired.

Additionally, in order to program a spare column in fuse program circuit 10, it is necessary to blow off a fuse element therein with a laser beam or the like. The number of fuse elements blown off is larger than the number of defective columns. At its maximum, in each of blocks A to D, it is necessary to blow off the same number of fuse elements as that of bits (n+1) of column address signals $A_0$ to $A_n$. An error tends to occur in programming the spare column and efficiency of repairing a defective bit is reduced.

Since different spare columns can be programmed in fuse program circuits 10a to 10d provided corresponding to blocks A to D, a defective column can be independently repaired in each block A to D. However, the selection circuit 11 and the fuse program circuit 10 must be provided for each block A to D, increasing the layout area and putting a serious obstacle to increasing density and integration of the semiconductor memory device.

Moreover, in fuse program circuit 10, it is necessary to detect a coincidence/non coincidence beteew the input address signal and the programmed spare column, then supply control signals $\phi A$ to $\phi O$ to selection circuit 11 and select I/O lines 8, 9, so that the access time is increased.

Furthermore, in each memory cycle, spare column select line 13 and spare I/O line 9 are accessed, so that power is wastefully consumed.

FIG. 5 is a diagram showing a structure of a main portion of another conventional semiconductor memory device. In FIG. 5, portions corresponding to those in the structure shown in FIG. 1 are given the same reference numerals.

The semiconductor memory device shown in FIG. 5 includes a switch circuit 4 provided between the outputs of a column decoder 3 and normal column select lines 40. Switch circuit 4 includes a switch element 14 provided between each of the outputs of column decoder 3 and a corresponding column select line 40, and a fuse element f accompanying each of switch elements 14. When the fuse element f is blown off, an associated switch element 14 becomes open, disconnecting the output of the column decoder 3 from column select line 40. Switch element 14, at the time of blowing off the associated fuse element f, also fixes the associated column select line 40 to "L" of a ground potential level, for example, and causes the column select line to be non-selected all the time. This semiconductor memory device also includes a spare column decoder 3a commonly provided in all the spare column forming regions 12 and a fuse program circuit 10 having a defective column address programmed through blown-off of the fuse elements therein. Fuse program circuit 10 determines a coincidence/ non coincidence between input address signals $A_0$ to $A_n$ and the programmed spare column address and supplies a signal $\phi$ indicating the result of the determination to spare column decoder 3a.

The structures and operation of the rest of the blocks 2a to 2d and so on are the same as those in the semiconductor memory device shown in FIG. 1 except that no spare I/O line is provided in regions 2a to 2d.

If an address of a column including a defective bit, i.e., a defective column address is specified in the test of the semiconductor memory device, the fuse element f of the corresponding switching element 14 is blown off and the defective column address (spare address) is programmed in fuse program circuit 10 through blown-off of the fuse element therein.

At the time of the operation of writing/reading data, even if a defective column is designated by internal column address signals $A_0$ to $A_n$, a column select signal is not supplied to a corresponding column select line 40. At this time, spare column decoder 3a is activated by a coincidence detecting signal from fuse program circuit 10 to supply a column select signal to a corresponding spare column select signal line 13. This spare column select signal causes a memory cell located at a crossing of the selected word line and the spare bit line pair in region 12 to be connected to I/O line pair 8.

In the semiconductor memory device shown in FIG. 5, only the columns that function normally are connected to I/O line pair 8, and a test mode such as the row simultaneous writing mode and the line mode test as stated above can be carried out in which a plurality of columns are simultaneously selected.

In the structure of FIG. 5 as well, however, the number of fuse elements to be blown off in order to program a spare column in fuse program circuit 10 is larger than that of defective columns. The maximum number of fuse elements to be blown off for programming is equal to the number of bits (n+1) of column address signals $A_0$ to $A_n$, causing an error to occur easily at the time of programming and reducing the efficiency of repairing defective bits.

Furthermore, as spare column decoder 3a is shared by blocks A to D, blocks A to D can have only the same column address repaired. Since each of blocks A to D has a defective bit not repaired independently, spare column forming region 12 cannot be used effectively and the efficiency of repairing defective bits is reduced.

Additionally, as switch circuit 4 is provided between column decoder 3 and column select line 40 and fuse program circuit 10 is also needed, the layout area is increased.

Furthermore, spare column decoder 3a is activated after fuse program circuit 10 detects a coincidence/non coincidence of the internal column address signal, so that the access time becomes longer.

A structure in which defective bits are repaired without using a spare decoder and a particular spare column or row is disclosed in Japanese Patent Publication No. 61-35636 and Japanese Patent Laying-Open No. 61-61300.

Japanese Patent Publication No. 61-35636 discloses a memory including a switch circuit provided between each output of a decoder and each row or column. A connection path of the switch circuit is set by blowing off a fuse element inside the switch circuit. As a result, a large number of fuse elements are blown off and the efficiency of repairing defective bits is decreased.

Japanese Patent Laying-Open No. 61-61300 discloses a memory including a switch provided between each output of a decoder and a column or row. This switch is capable of selectively connecting one output of the decoder to one of a plurality of adjacent rows or columns. The defective row or column is disconnected from the decoder output and the output of the decoder is connected to an adjacent row or column through the switch.

Though both of the prior arts take account of repairing a defective bit in one memory cell array only, they have no regard for repairing of a defective bit on a block basis in a memory device of a block dividing scheme.

SUMMARY OF THE INVENTION

An object of the present invention is to provide a defective bit repairing circuit capable of efficiently repairing a defective bit in a memory of a block dividing scheme.

Another object of the present invention is to provide a defective bit repairing circuit in a memory of a block dividing scheme, capable of repairing a defective bit without increasing a layout area, power consumption and access time.

A defective bit repairing circuit according to the present invention includes a main row or column select line connected to the output of a decoder, and a sub row or column select line provided in each block. The main row or column select line is provided commonly in a plurality of memory blocks. The number of sub row or column select lines provided is larger than that of main row or column select lines by 1 or more.

The defective bit repairing circuit further includes a switch unit provided in each block for selectively connecting the main row or column select line to the sub row or column select line. The switch unit includes a switch circuit provided between the main row or sub column select line and a plurality of sub row or column select lines. The switch circuit connects one of the plurality of sub row or column select lines to a corresponding main row or column select line.

The defective bit repairing circuit further includes means for setting a connection path of the switch circuit. This setting means is provided in each block. With this setting means, a defective row or column is disconnected from the main row or sub column select line, the main row or column select line is connected to a sub row or column select line adjacent to the defective row or column, and the connection of the decoder outputs is sequentially shifted.

In accordance with the structure stated above, it is possible to repair a defective bit without providing a spare decoder. Also, as a connection path of the switch unit can be set in each block by the setting means, repairing of a defective bit can be carried out independently in each block.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
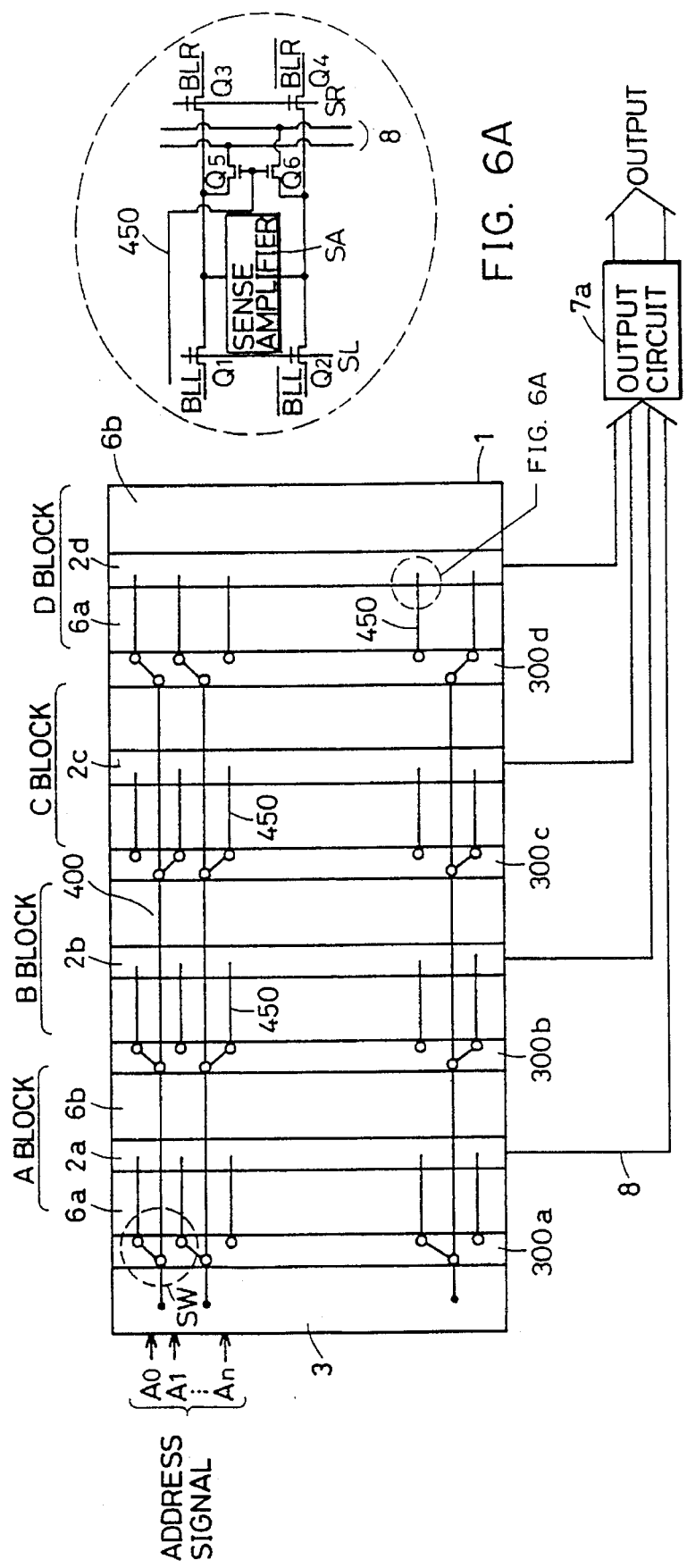
FIG. 6 schematically shows an overall structure of a semiconductor memory device according to one embodiment of the present invention.

FIG. 6 schematically shows a structure of a portion related to repairing of defective bits in a semiconductor memory device according to one embodiment of the present invention.

In FIG. 6, the semiconductor memory device includes a memory cell array 1 divided into four memory blocks A to D. Each of memory blocks A to D includes two subarrays 6a and 6b. It includes (sense amplifier+I/O) blocks 2a to 2d between subarrays 6a and 6b. Each of subarrays 6a and 6b includes a plurality of memory cells arranged in rows and columns.

Main column select lines 400 are disposed across the four memory blocks A to D. Main column select lines 400 are provided corresponding to each output of a column decoder 3 and a column select signal is supplied thereon. Sub column select lines 450 are independently provided for each of blocks A to D. The number of sub column select lines 450 is larger than that of main column select lines 400 by 1 in each block. Therefore, the number of columns (bit line pairs) of subarrays 6a and 6b is larger than the number of outputs of column decoder 3 by 1, in accordance with the number of main column select lines 400.

Figure 2:
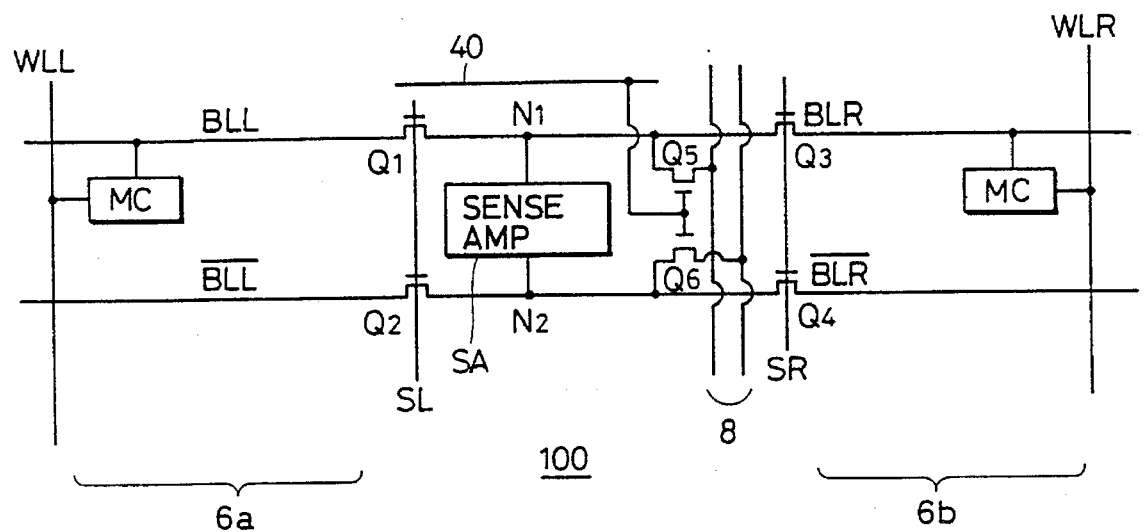
FIG. 2 shows a detailed structure of a portion related to a normal column in a (sense amplifier+I/O) block shown in FIG. 1.
Figure 3:
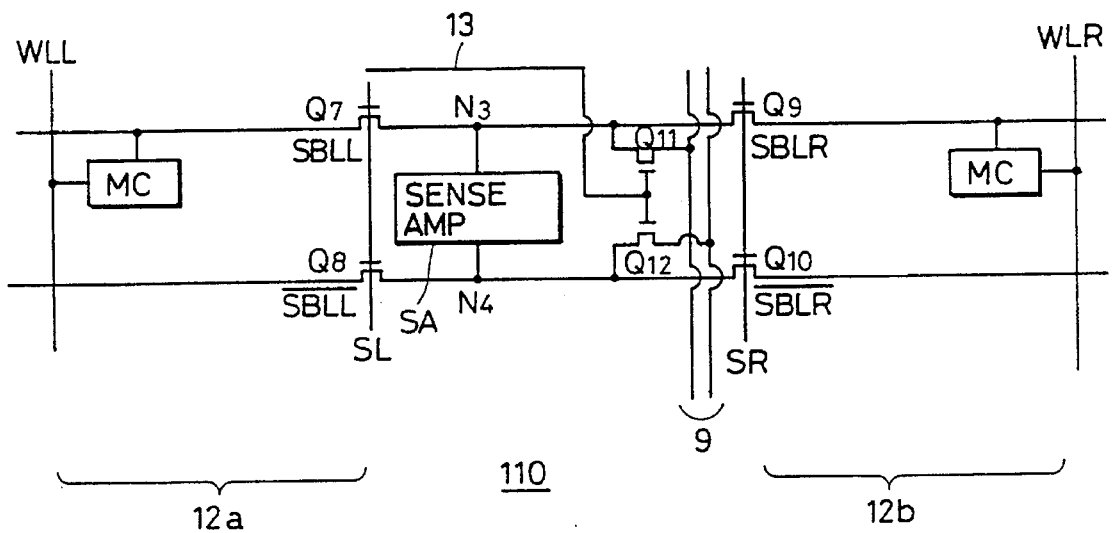
FIG. 3 shows a detailed structure of a portion related to a spare column in the (sense amplifier+I/O) block shown in FIG. 1.
Figure 4:
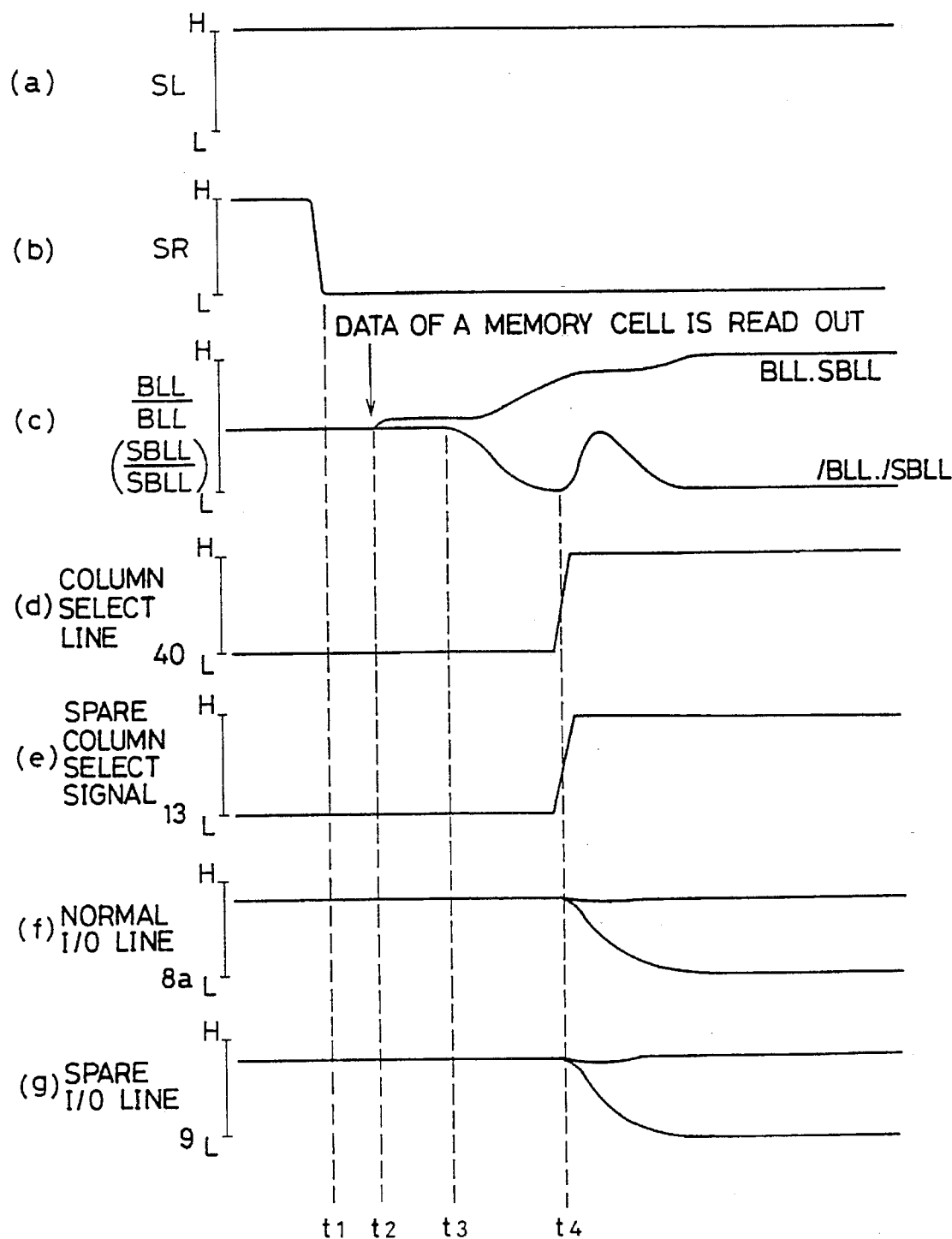
FIG. 4 is a signal waveform diagram showing the operation of the semiconductor memory device shown in FIG. 1.
Figure 5:
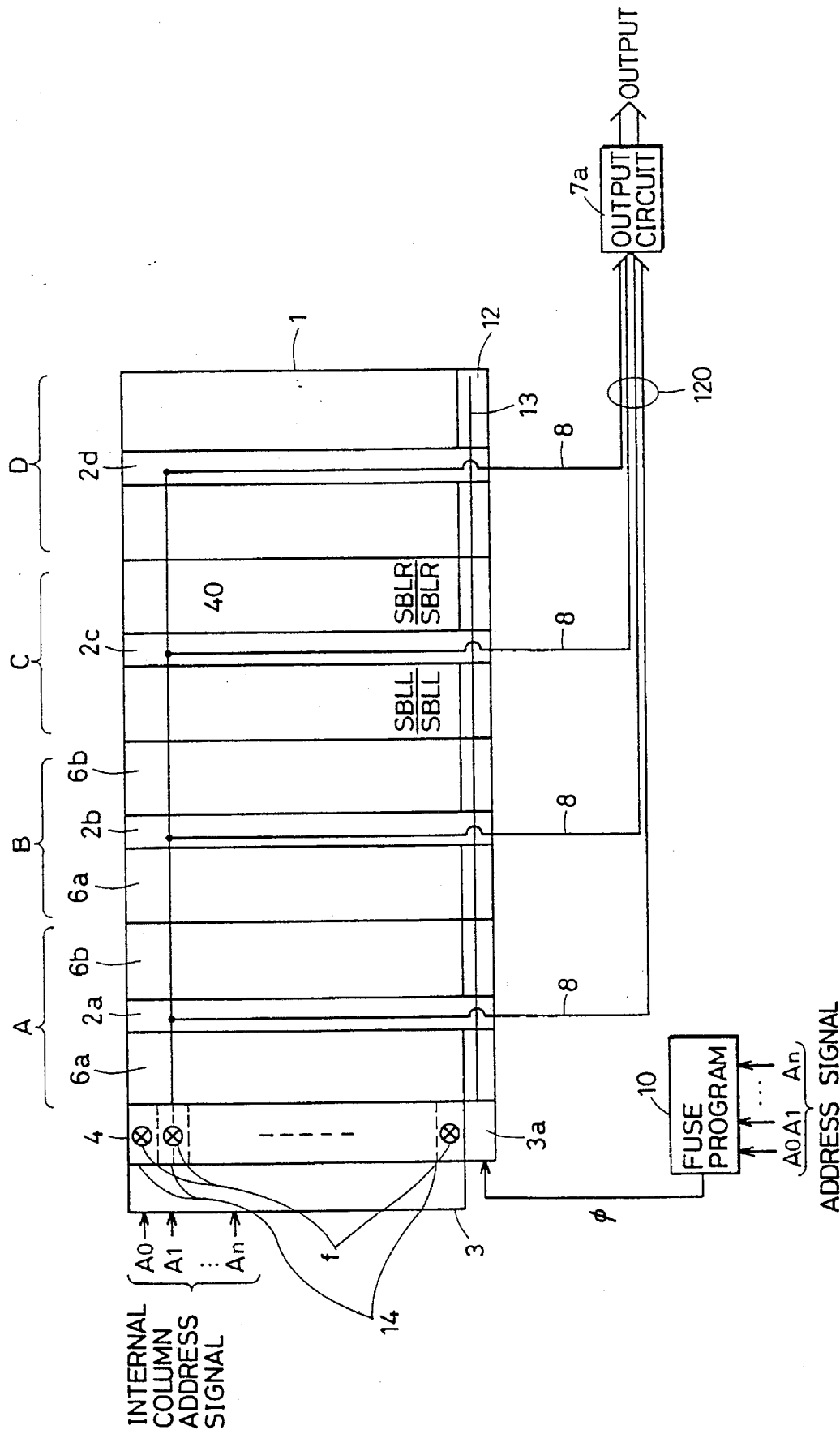
FIG. 5 schematically shows a structure of a portion related to repairing of a defective column in another conventional semiconductor memory device.

(Sense amplifier+I/O) blocks 2a to 2d are provided between subarrays 6a and 6b in each of blocks A to D. The structures of blocks 2a to 2d are the same as the conventional structures shown in FIG. 2 except that a column select signal is supplied to column select gates Q5, Q6 through sub column select lines 450.

Shift redundancy circuits 300a to 300d are provided for connecting main column select lines 400 to sub column select lines 450 in each of blocks A to D.

Each of shift redundancy circuits 300a to 300d includes switch circuits SW provided corresponding to each of main column select lines 400. Each of switch circuits SW selectively connects one of main column select lines 450 to one of two adjacent sub column select lines 450.

Figure 1:
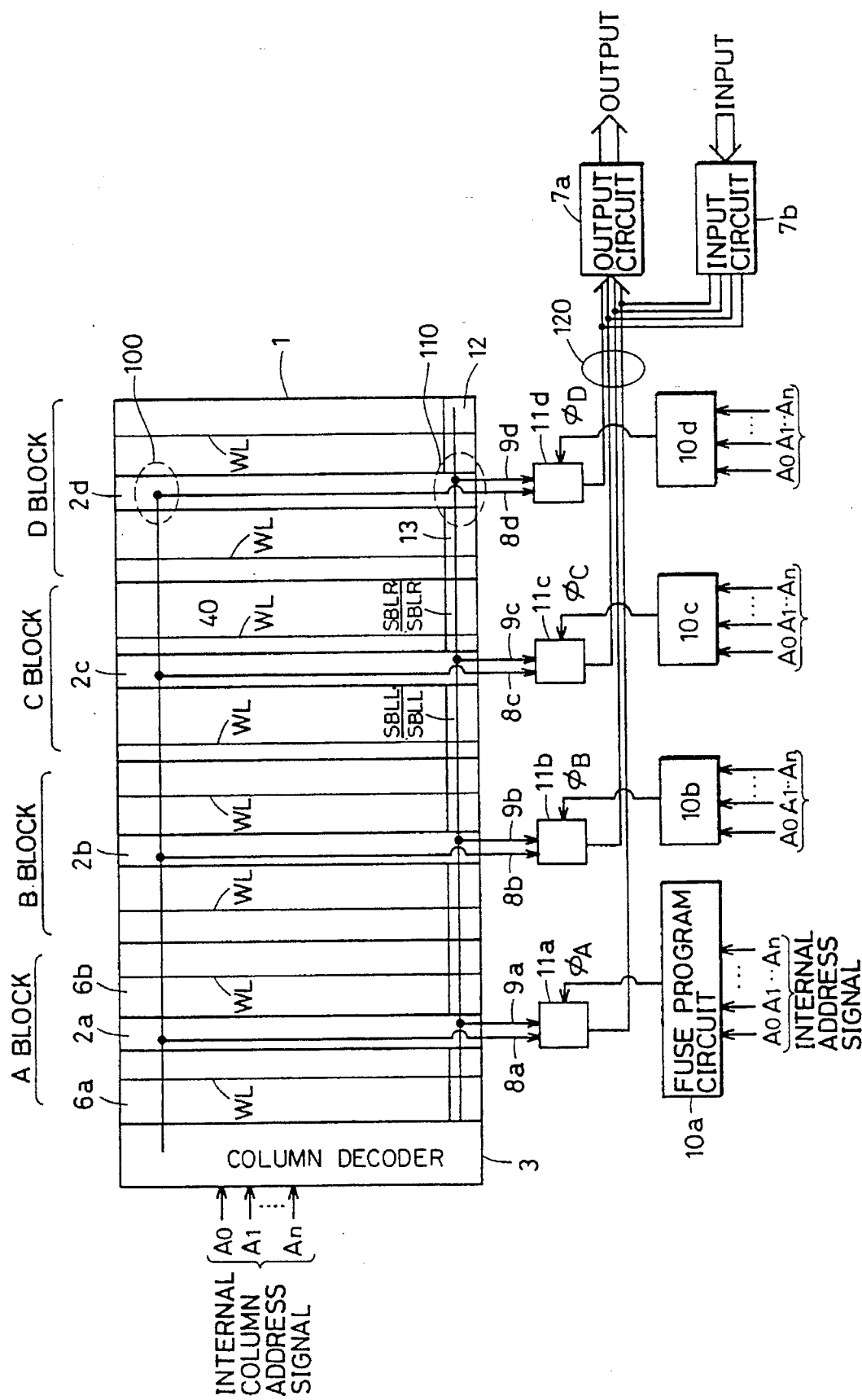
FIG. 1 schematically shows a structure of a portion related to repairing of a defective bit in a conventional semiconductor memory device.

Other structures are the same as those in the conventional memory shown in FIG. 1.

After manufacturing a memory device, a functional test is conducted. If a defective column is detected, a connection path of the switch circuit SW is set so that a sub column select line 450 and a main column select line 400 corresponding to the defective column are disconnected from each other in the shift redundancy circuit 300 (circuits 300a to 300d are representatively indicated by the reference numeral 300). At this time, a main column select line corresponding to the defective column and subsequently adjacent main column select lines (on one side in the outputs of the column decoder 3) have the connection thereof shifted by one column and connected by the sub column select lines. The connection paths of the rest of the main column select lines remain the same as in the case of a normal column.

Figure 7:
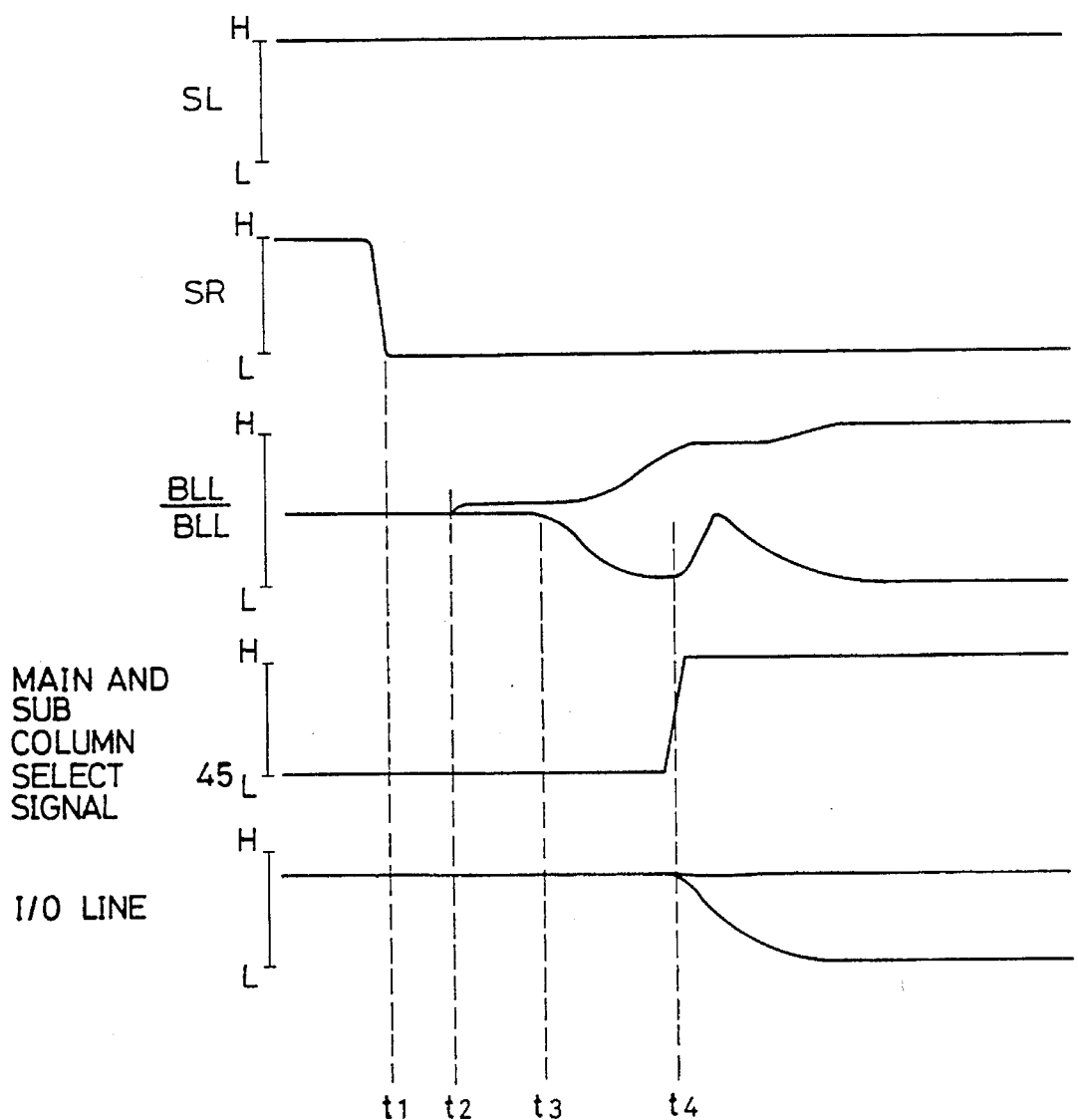
FIG. 7 is a signal waveform diagram showing the operation of the semiconductor memory device shown in FIG. 6.

The paths of switch circuits SW are set independently in each of shift redundancy circuits 300a to 300d. Detection of defective bits in each block A to D is carried out by observing 4-bit data Q supplied from each block A to D in parallel at the time of the test. The operation of reading data will be described in the following with reference to FIG. 7 which is an operation waveform diagram thereof.

Let us think of a case in which subarray 6a on the left side is active to include a selected word line. As subarray 6a on the right side does not include a selected word line, it maintains the same state as a precharge state. The operation in the memory cell array 1 is the same as in the conventional one. Firstly, subarray 6b on the right side which is not selected at the timing t1 is disconnected by bringing a signal SR to "L". Then, the selected word line rises at the timing t2, data of the memory cells are read on one side of each bit line pair (in this case, BLL), and a potential difference is caused between the bit line pair (here, "H" data reading).

At the timing t3, sense amplifier SA is activated and amplifies the very small potential difference generated in the bit line pair. At the timing t4 when the potential difference becomes sufficiently large in the bit line pair, a main column select line 400 selected by the internal column address signals $A_0, A_1 \ldots A_n$ is activated, sub column select lines 450 are activated through switch circuits SW in shift redundancy circuits 300, and the selected bit line pair BLL, BLL are connected to I/O line 8. In this way, a potential difference is generated in I/O line 8 and amplified in output circuit 7a to be supplied as an output.

Figure 8:
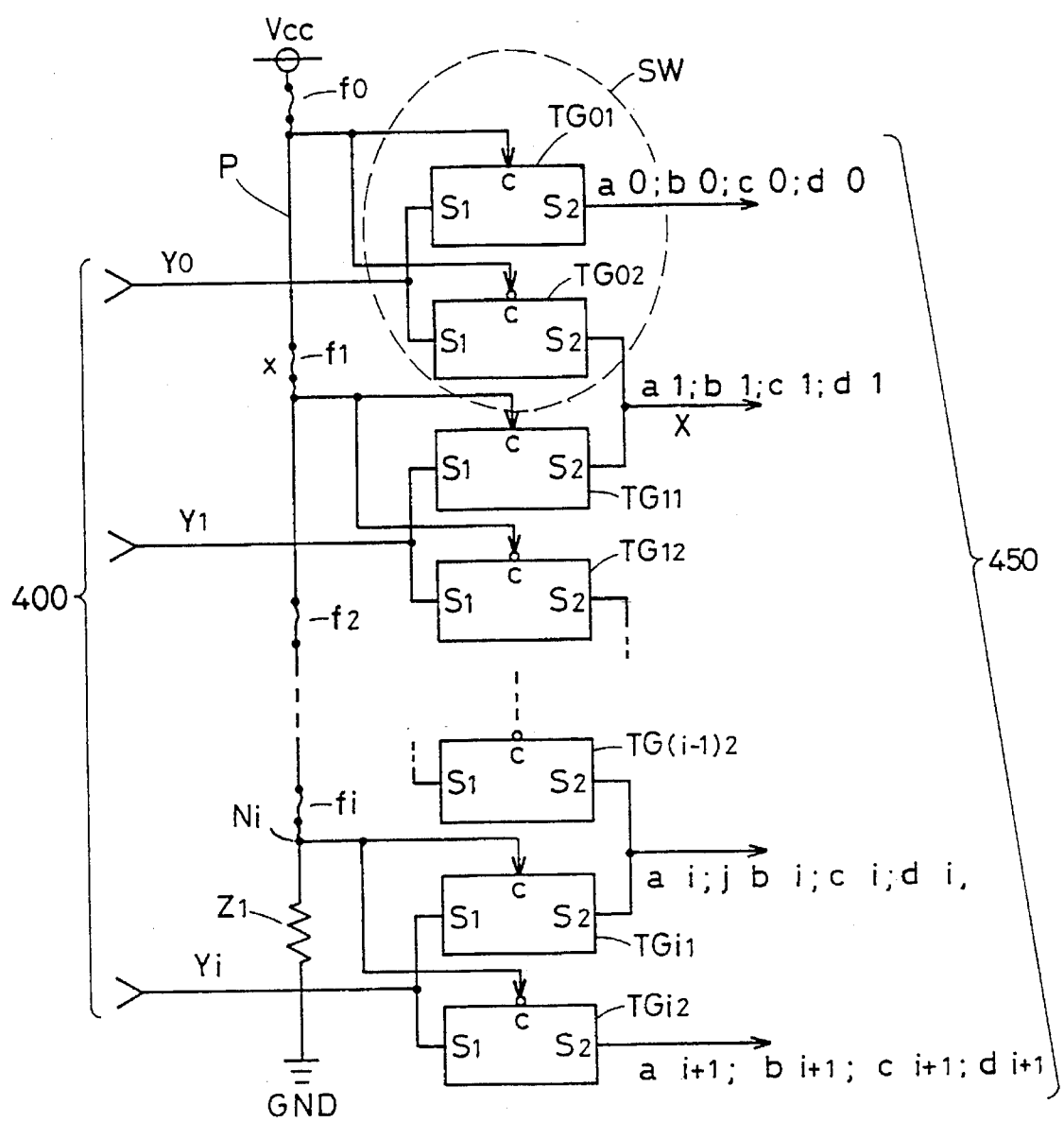
FIG. 8 shows a specific structure of a shift redundancy circuit shown in FIG. 6.

One example of a specific structure of the shift redundancy circuit is shown in FIG. 8. In FIG. 8, in order to make a distinction among main column select lines 400, they are indicated by signal lines $Y_0$ to $Y_i$. Also, in order to make a distinction among sub column select lines 450, they are indicated by signal lines $a_0$ to $a_{i+1}$, $b_0$ to $b_{i+1}$, $c_0$ to $C_{i+1}$, $d_0$ to $d_{i+1}$. The reference symbols $a_0$ to $a_{i+1}$ indicate the sub column select lines for block A, $b_0$ to $b_{i+1}$ indicate the sub column select lines for block B, $c_0$ to $c_0$ to $c_{i+1}$ indicate the sub column select lines for block c, and $d_0$ to $d_{i+1}$ indicate the sub column select lines for block D. Although sub column select lines $a_0$ to $a_{i+1}$ for block A are only referred to in the following description, repairing of a defective bit is also carried out in blocks B to D in the same manner.

Referring to FIG. 8, the shift redundancy circuit 300 includes switch elements TG01, TG02 to TGi1, TGi2 provided between each of main column select lines $Y_0$ to $Y_i$ and each of the sub column select lines $a_0$ to $a_{i+1}$ and a potential supply path P as potential setting means for setting ON/OFF of switch elements TG01, TG02 to TGi1, TGi2.

A pair of switch elements TGk1, TGk2 (k is an integer of 0 to i) provide a switch circuit SW shown in FIG. 6. The switch element TG (representatively showing switch elements TG01, TG02 to TGi1, TGi2) includes a terminal S1 connected to main column select line Y (representatively showing main column select lines $Y_0$ to $Y_i$), a terminal S2 connected to sub column select line a (representatively showing the sub column select lines $a_0$ to $a_{i+1}$), and a control terminal C for receiving a signal controlling ON/OFF. Switch element TGk1 is turned on and connects a main column select line $Y_k$ to a sub column select line $a_k$ when a reference voltage $V_{cc}$ which is an operation power supply voltage, for example, is supplied to control terminal C.

Switch element TGk2 is turned on and connects main column select line $Y_k$ to a sub column select line $a_{k+1}$ when a reference voltage VGND at a ground level, for example, is supplied to control terminal C.

Main column select line $Y_k$ is provided with the two switch elements TGk1 and TGk2 and one main column select line $Y_k$ can be selectively (in an alternative way) connected to two adjacent sub column select lines $a_k$, $a_{k+1}$.

Potential supply path P includes (i+1) fuse elements $f_0$ to $f_{i+1}$ connected in series between voltage supply $V_{cc}$ and a node $N_i$ and a resistor Z1 having a high resistance connected between node $N_i$ and the ground GND. Fuse elements $f_0$ to $f_i$ are provided corresponding to main column select lines $Y_0$ to $Y_i$, respectively. A node of fuse element $f_k$ (k=0 to i) closer to resistor Z1 (hereinafter referred to as lower node) is connected to control terminals C of switch elements TGk1 and TGk2. As a result, only one of the switch elements TGk1 and TGk2 is turned on.

A description will now be made of a method of repairing a defective column.

The defective column address of each of blocks A to D has been already specified by a functional test of the memory device. Suppose now that there is a defective bit in a column connected to sub column select line $a_1$. Before fuse elements $f_0$ to $f_1$ are blown off, the lower nodes of fuse elements $f_0$ to $f_i$ are at "H" of the voltage $V_{cc}$ level, switch elements TG01 to TGi1 are in an ON state, and switch elements TG02 to TGi2 are in an OFF state.

Fuse element $f_1$ corresponding to main column select line $Y_1$ is blown off in order to disconnect main column select line $Y_1$ and sub column select line $a_1$. The potentials of the lower nodes of fuse elements $f_1$ to $f_i$ attain "L" of the ground level through resistor Z1. The lower node of fuse element $f_0$ is at "H" of the voltage $V_{cc}$ level. As a result, switch elements TG01, TG12 to TGi2 are turned on and switch elements TG02, TG11 to TGi1 are turned off. Main column select lines $Y_1$ to $Y_i$ are connected to sub column select lines $a_2$ to $a_{i+1}$, respectively. Main column select line $Y_0$ is connected to sub column select line $a_0$. Sub column select line $a_1$ is disconnected from main column select line Y and brought to a non-selected state since switch elements TG02, TG11 are both in the OFF state.

Assuming that ADk represents an address of main column select line $Y_k$, when an address AD1 is designated, sub column select line $a_2$ is selected. Similarly, at the time of accessing an address ADn (n>1), a sub column select line $a_{n+1}$ is selected.

Generally, if the defective column corresponds to a sub column select line $a_m$, a fuse element $f_m$ is blown off. At this time, switch elements TG01 to TG (m−1) 1 and TGm2 to TGi2 are turned on and switch elements TG02 to TG (m−1) 2 and TGm1 to TGi1 are turned off. At the time of accessing an address ADm, a sub column select line $a_{m+1}$ is selected. At the time of accessing an address ADp (m≦p≦i), a sub column select line $a_{(p+1)}$ is selected. At the time of accessing an address ADq (0≦q≦m−1), sub column select line $a_q$ is selected. Sub column select line $a_m$ corresponding to the defective column is brought to the non-selected state all the time and repairing of the defective bit is effected.

Figure 9:
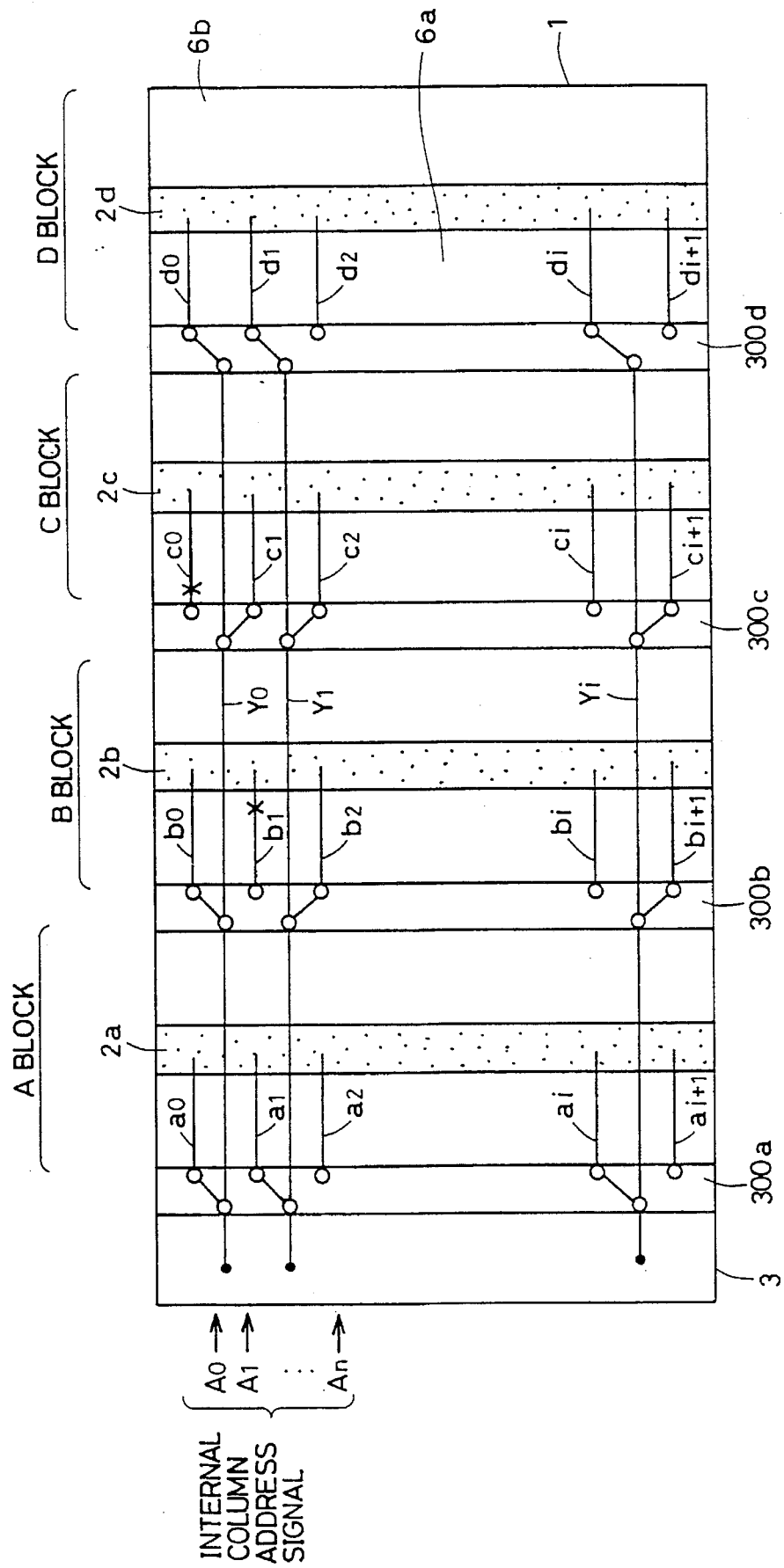
FIG. 9 illustrates a state in which the shift redundancy circuit shown in FIG. 8 has repaired a defective column of the semiconductor memory device in FIG. 6.

FIG. 9 shows a manner in which repairing of defective bits are carried out independently in each of blocks A to D. In FIG. 9, suppose that columns corresponding to sub column select line $b_1$ (block B) and sub column select line $c_0$ (block C) are defective columns and the remaining columns are all normal.

As there is no defective column in block A and block D, blowing off of a fuse element is not carried out in shift redundancy circuits 300a and 300b. Main column select lines $Y_0$ to $Y_i$ are connected to sub column select lines $a_0$ to $a_i$ . . . , $d_0$ to $d_i$, respectively.

In shift redundancy circuit 300b for block B, a fuse element ($f_1$) corresponding to sub column select line $b_1$ is blown off. Main column select line $Y_0$ is connected to sub column select line $b_0$ and main column select lines $Y_1$ to $Y_i$ are connected to sub column select lines $b_2$ to $b_{i+1}$, respectively.

In shift redundancy circuit 300c for block C, a fuse element ($f_0$) corresponding to sub column select line $c_0$ is blown off.

Sub column select line $c_0$ is disconnected from main column select line $Y_0$. Main column select lines $Y_0$ to $Y_i$ are connected to sub column select line $c_1$ to $c_{i+1}$.

Even if columns of different addresses in blocks A to D are defective, repairing of defective bits is effected independently in each of blocks A to D as far as the number of defective columns in each of blocks A to D is 1.

After repairing of defective bits is effected for each block A to D, memory cell array 1 has no defective bit, so that there is no need to detect a coincidence/non coincidence of an address signal and a defective address in the fuse program circuit and only a control is carried out to supply a signal to the selection circuit as shown in the conventional embodiment. Also, it is possible to perform a test such as row simultaneous writing and a line mode test in which a plurality of column select lines are simultaneously selected.

Figure 10:
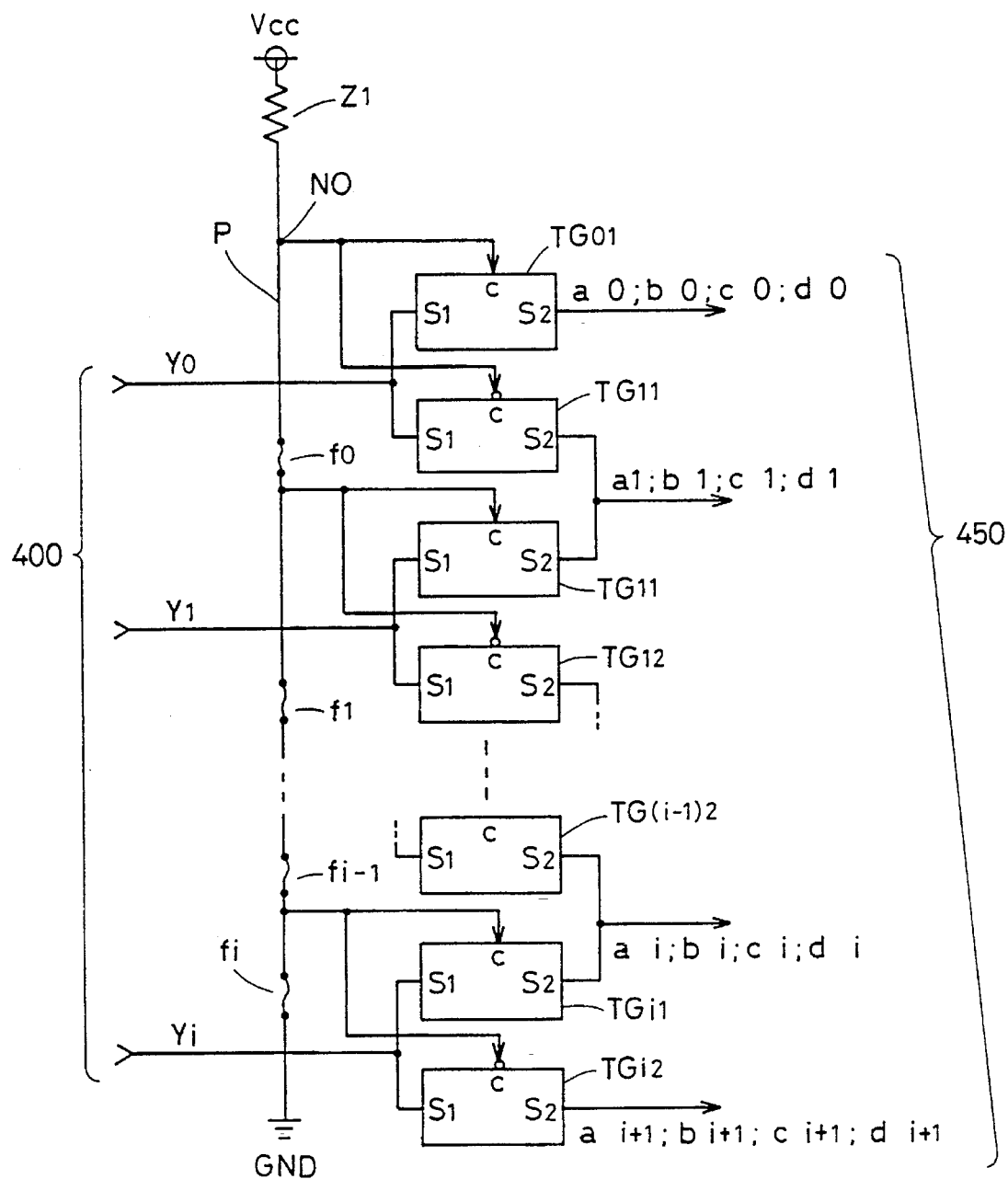
FIG. 10 shows another structure of the shift redundancy circuit.

FIG. 10 shows another structure of the redundancy circuit. In FIG. 10, potential supply path P includes a high resistance resistor Z1 connected between the node N0 and voltage source $V_{cc}$ and (i+1) fuse elements $f_0$ to $f_i$ connected in series between the node N0 and the ground GND.

The structure of switch circuit SW is the same as that shown in FIG. 8. The nodes of fuse elements $f_0$ to $f_i$ closer to the resistor (hereinafter referred to as upper node) are connected to control terminals C of corresponding switch elements.

Before fuse elements $f_0$ to $f_i$ are blown off, the potentials of the upper nodes of fuse elements $f_0$ to $f_i$ are all "L". At this time, switch elements TG01 to TGi1 are turned off and switch elements TG02 to TGi2 are turned on. Main column select lines $Y_0$ to $Y_i$ are connected to sub column select lines $a_1$ to $a_{i+1}$ ($b_1$ to $b_{i+1}$, or $c_1$ to $c_{i+1}$, $d_1$ to $d_{i+1}$), respectively.

If there is a defective column, repairing of the defective bit is effected by blowing off a corresponding fuse element in a similar way as that of the structure of FIG. 8. In the structure of FIG. 10, however, at the time of repairing the defective bit, the connection path of the main column select line shifts in the opposite direction of that in the structure of FIG. 8, i.e., in the upward direction in FIG. 10.

Figure 11:
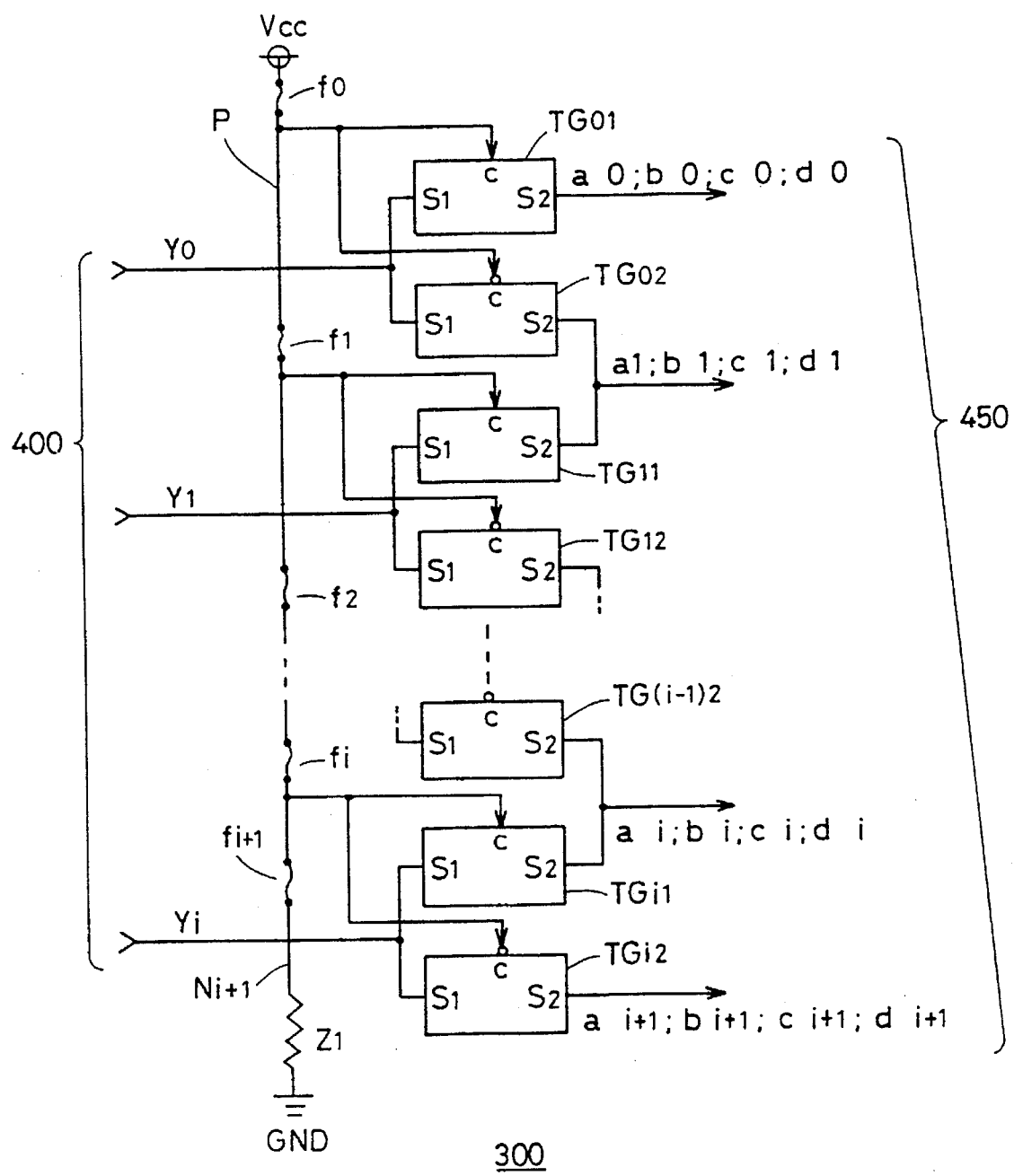
FIG. 11 shows still another structure of the shift redundancy circuit.

FIG. 11 shows still another structure of the shift redundancy circuit. In FIG. 11, a potential supply path P includes (i+2) fuse elements $f_0$ to $f_{i+1}$ connected in series between voltage source $V_{cc}$ and a node $N_{i+1}$ and a resistor having a high resistance Z1 connected between the node and the ground GND. The structure of other portions is the same as that shown in FIG. 8. At the time of repairing a defective bit, a corresponding fuse element is blown off in the same manner as in the case in which the structure of FIG. 8 is employed. In the structure shown in FIG. 11, fuse element $f_{i+1}$ is blown off if there is no defective bit in corresponding blocks A to D. Therefore, in the potential supply path P, even if there is no defective bit, the path between voltage source $V_{cc}$ and the ground GND is cut off, so that there is no path through which current flows and reduction in power consumption (current) is achieved.

Figure 12:
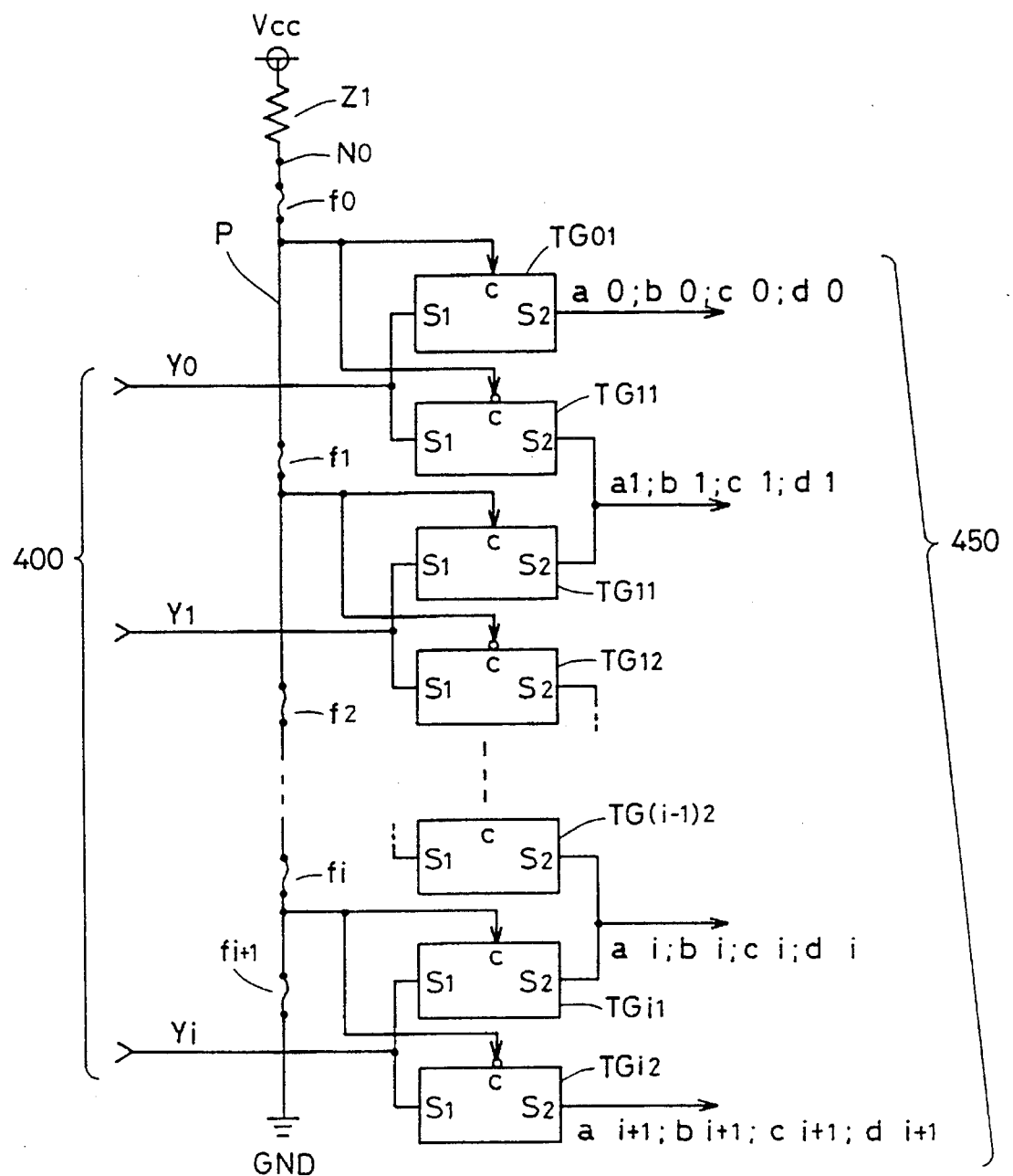
FIG. 12 shows yet another structure of the shift redundancy circuit.

FIG. 12 shows an example of still another structure of the shift redundancy circuit. In FIG. 12, a potential supply path P includes a resistor Z1 having a high resistance connected between a voltage source $V_{cc}$ and a node N0 and (i+2) fuse elements $f_0$ to $f_{i+1}$ connected in series between the node N0 and the ground GND. The structure of other portions is the same as that shown in FIG. 10. In the structure shown in FIG. 12, when the defective column is sub column select line $a_m$, fuse element $f_m$ is blown off. That is, when the defective column is connected to main column select line $Y_m$, fuse element $f_{m+1}$ is blown off. As a result, repairing of the defective column is carried out in the same way as in the case where the structure of FIG. 10 is employed.

Even if there is no defective bit in a related block, fuse element $f_0$ is blown off. As a result, there is no current flowing path in potential supply path P and a shift redundancy circuit with a reduced current (power) consumption is achieved in the same manner as in the structure of FIG. 11.

Figure 13:
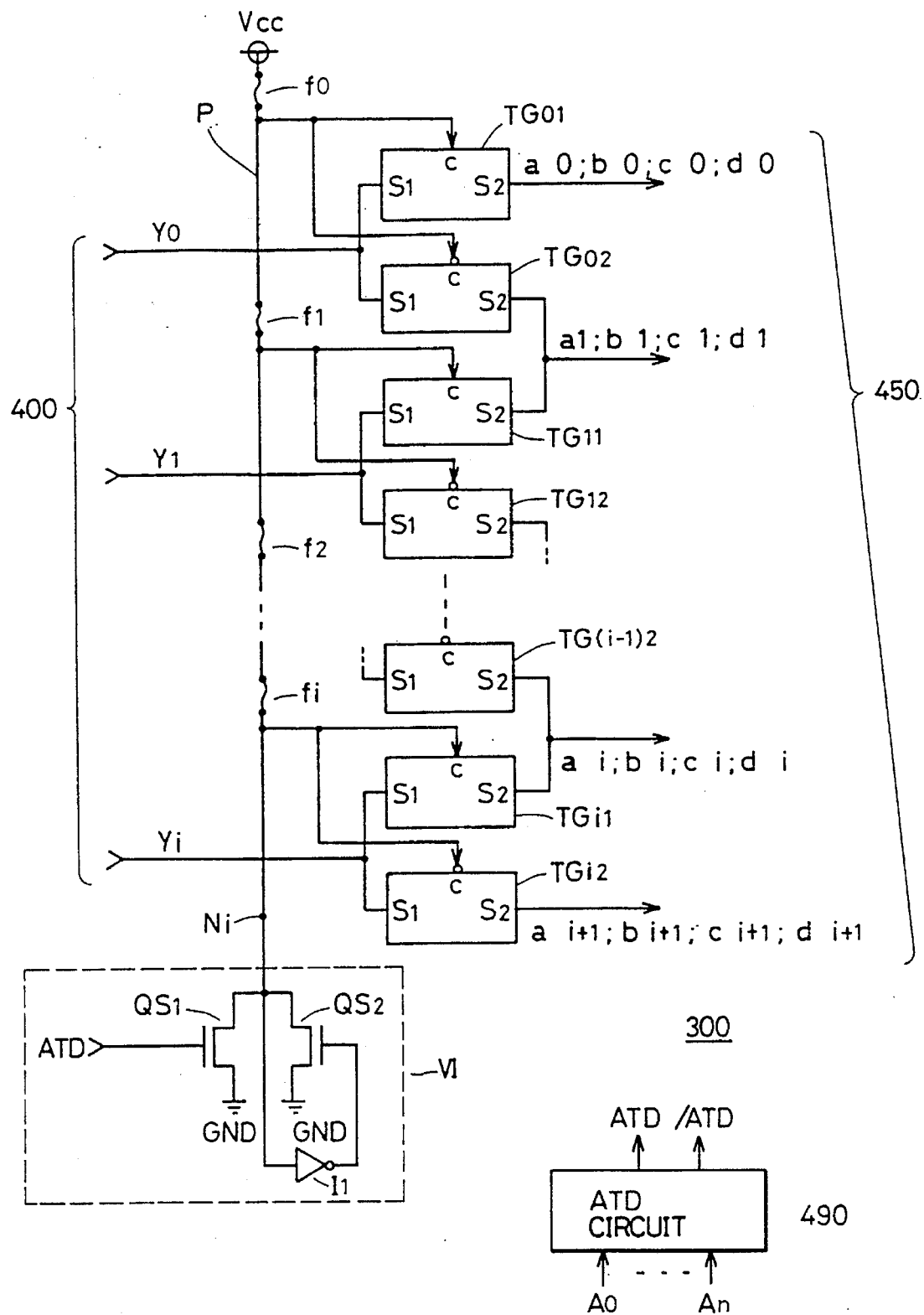
FIG. 13 shows still another structure of the shift redundancy circuit.

FIG. 13 shows still another Structure of the redundancy circuit. In FIG. 13, a potential setting circuit VI is provided for potential supply path P in place of the resistor Z1 having a high resistance shown in FIG. 8. The structure of the rest of the portions is the same as that in FIG. 8. Potential setting circuit VI includes an n channel MOS transistor $QS_i$ having one conduction terminal connected to the node $N_i$ and the other conduction terminal connected to the ground GND for receiving an address transition detection signal ATD at the gate, an inverter I1 for inverting the potential of the node $N_i$, and an n channel MOS transistor $QS_2$ having one conduction terminal connected to the node Ni and the other conduction terminal connected to the ground for receiving the output of the inverter I1 at the gate.

The address transition detection signal ATD is generated in response to the transition of the input address signal. Generally, in an internal synchronization type memory, the operation timing of the internal circuitry is determined using this signal ATD (and an inverted signal thereof $\overline{ATD}$) as a clock signal. In an address transition detection circuit 490, normally, when the memory is a DRAM (Dynamic Random Access Memory), a row address signal and a column address signal are supplied in a time division multiplexing manner, and signals ATD, $\overline{ATD}$ are generated in response to the transition of the row address signal. In the case of repairing of a defective column shown in FIG. 13, address transition detection signal ATD may be generated in response to the transition of the column address signal. In the case of an SRAM (Static Random Access Memory), as a row address signal and a column address signal are simultaneously supplied, the transition in either address signal may be detected and the transition in both the row and column address signals may be detected.

An operation of the potential setting circuit will now be described. The on-resistance of transistor $QS_1$ is set to a sufficiently large value so that the potential of potential supply path P attains "H" of the voltage $V_{cc}$ level when fuse elements $f_0$ to $f_i$ are all in a non-blown off state.

When an input address signal makes a transition, the address transition detection signal ATD is generated from address transition detection circuit 490 (signal ATD rises to "H"). In response to this, transistor $QS_1$ is turned on and the node $N_i$ is connected to the ground GND through the on-resistance of transistor $QS_1$.

When fuse elements $f_0$ to $f_i$ are all in the non-blown off state, the on-resistance of transistor $QS_1$ is sufficiently large, so that the potential of potential supply path P is "H". When any of fuse elements $f_0$ to $f_i$ is blown off, the potential of a portion disconnected from the voltage source $V_{cc}$ in potential supply path P falls to "L". When the potential of the node $N_i$ falls, the output of inverter I1 rises to "H" and transistor $QS_2$ is turned on. If the current drive capability of transistor $QS_2$ is sufficiently large, the potential of the node $N_i$ is falls to "L". The potential of the node $N_i$ ("L") is latched by this inverter I1 and transistor $QS_2$ and the potential of a portion disconnected from voltage source $V_{cc}$ of the potential supply path is fixed to "L".

With this potential setting circuit VI, it is possible to set the potential of potential supply path P to "L" of the ground potential GND in a rapid and stable manner even immediately after the power is turned on.

Figure 14:
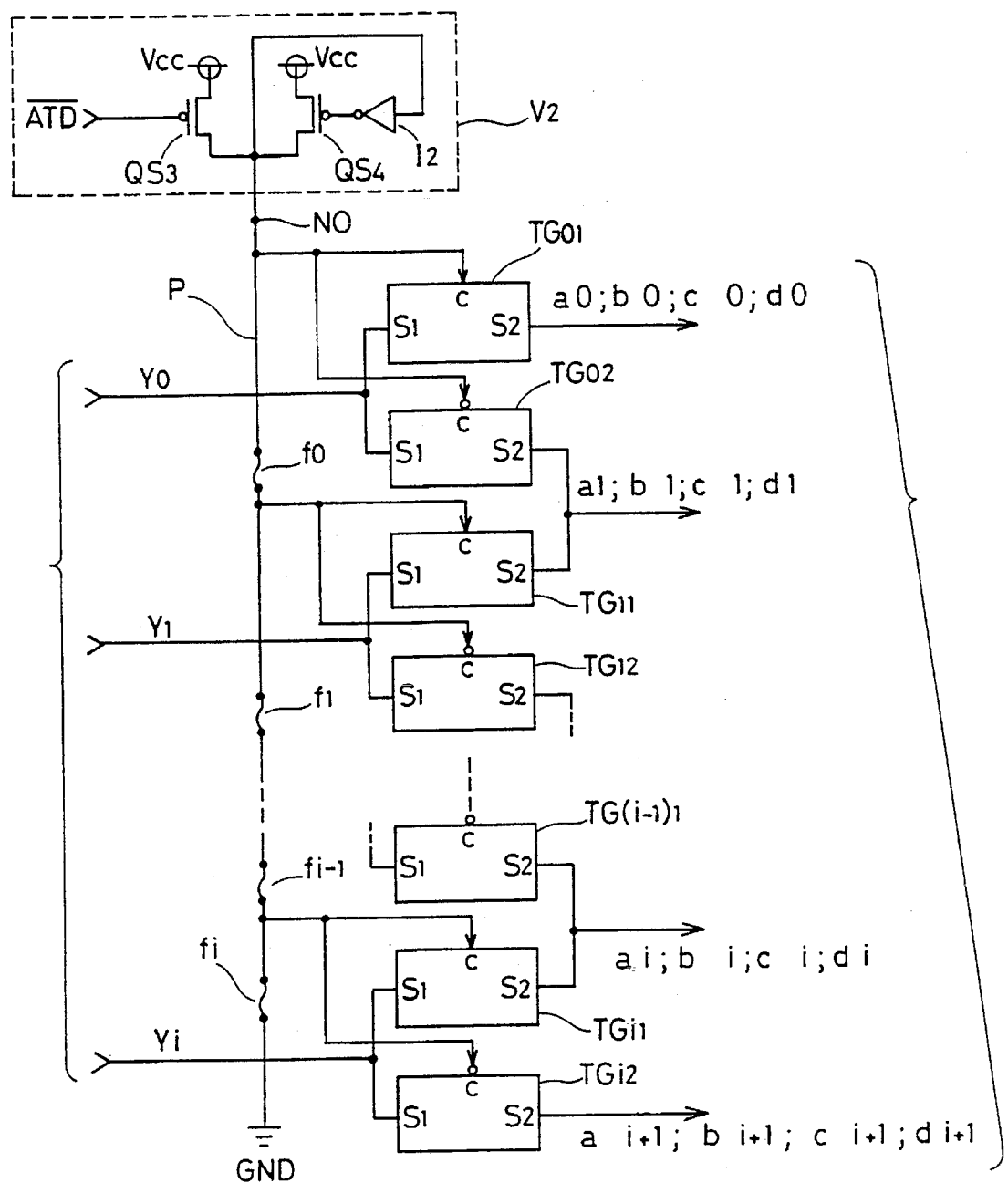
FIG. 14 shows yet another structure of the shift redundancy circuit.

FIG. 14 shows an example of still another structure of the shift redundancy circuit. In FIG. 14, a potential setting circuit V2 is provided in place of resistor Z1 having the high resistance shown in FIG. 10. Potential setting circuit V2 includes a p channel MOS transistor $QS_3$ having one conduction terminal connected to the node $N_0$ and the other conduction terminal connected to the voltage source $V_{cc}$ and a gate receiving an address transition detection signal $\overline{ATD}$, an inverter I2 for inverting the potential of the node $N_0$, and a p channel MOS transistor $QS_4$ having one conduction terminal connected to the node $N_0$ and the other conduction terminal connected to the voltage source $V_{cc}$ and a gate receiving the output of inverter I2. Transistor $QS_3$ has a sufficiently large on-resistance and transistor $QS_4$ has a relatively large current drive capability. The structure of the rest of the portions is the same as that shown in FIG. 10.

The signal $\overline{ATD}$ is generated from the same circuit as address transition detection circuit 490 shown in FIG. 13 and attains "L" at the time of detecting address transition.

When the signal $\overline{ATD}$ is generated and attains "L", transistor $QS_3$ is turned on and is about to connect the node $N_0$ to the ground GND. If all of fuse elements $f_0$ to $f_i$ are in the non-blown off state, the potential of potential supply path P is "L" of the ground GND level due to the sufficiently large on-resistance of transistor $QS_3$. If any of fuse elements $f_0$ to $f_i$ is blown off, the portion disconnected from the ground GND of potential supply path P starts rising from "L" to "H". The output of inverter I2 falls to "L" in response to the rise of the potential of this portion (node $N_0$). As a result, transistor $QS_4$ is turned on and the potential of the portion disconnected from the ground GND in potential supply path P rapidly rises to the voltage $V_{cc}$ level. Transistor $QS_4$ and inverter I2 provide a latch, and latch the potential of the node $N_0$ to "H".

With potential setting circuit V2 shown in FIG. 14, it is possible to set the potential of the portion disconnected from the ground GND in potential supply path P to the voltage $V_{cc}$ level at higher speed and more stably, compared with the structure in which potential supply path P is charged through resistor Z1.

Figure 15:
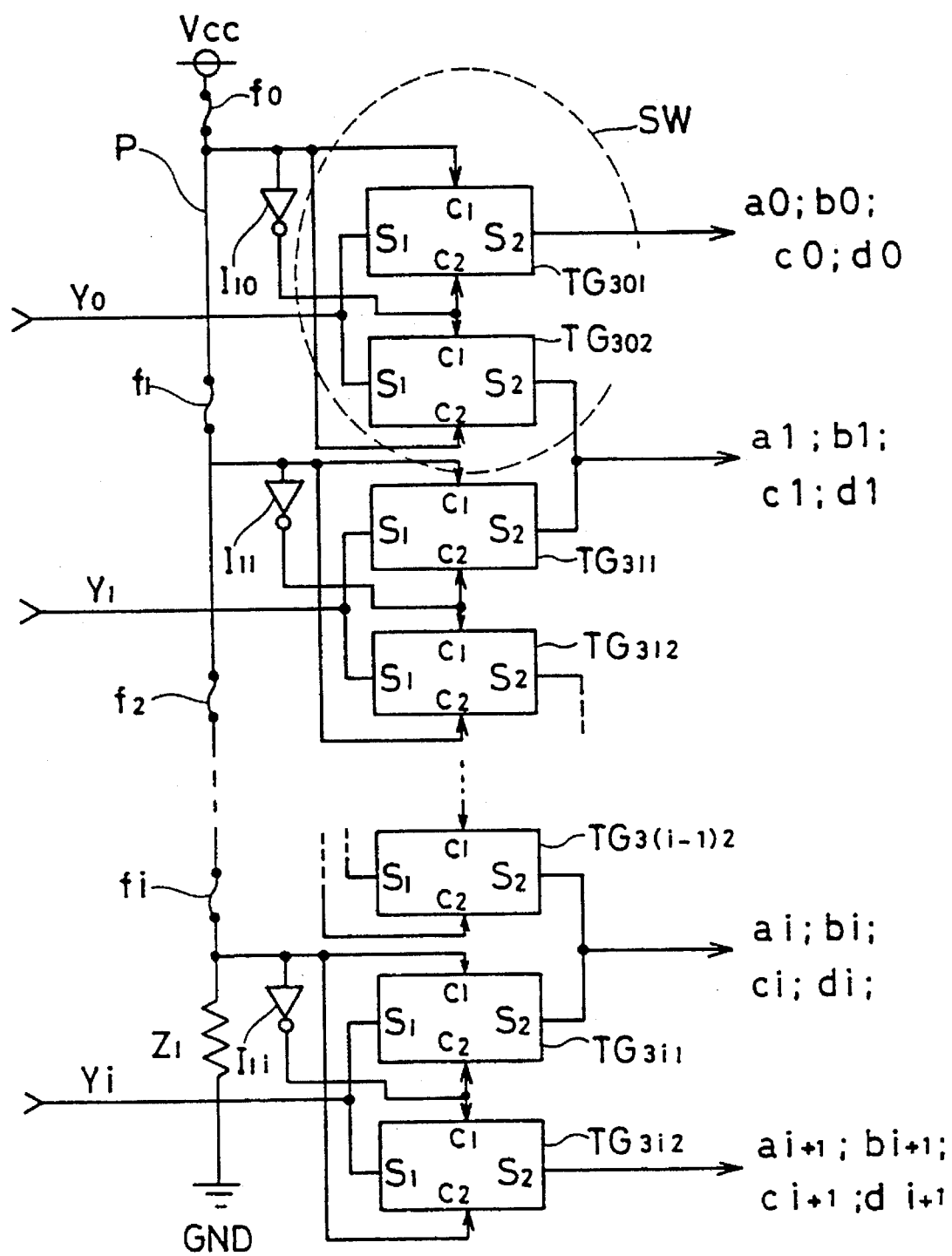
FIG. 15 shows another structure of the shift redundancy circuit.

FIG. 15 is a diagram showing still another structure of redundancy circuit 300. In FIG. 15, a switch circuit SW includes switch elements TG3K1 and TG3k2 (k=0 to i) including a pair of bidirectional transmission gates. Switch element TG3 (representatively indicating elements TG301, TG302 to TG3i1, TG3i2) includes a terminal $S_1$ connected to a main column select line Y, a terminal $S_2$ connected to a sub column select line a (b; c; d), a control terminal C1 connected to a lower node of fuse element f, and a control terminal C2 connected to the lower node of fuse element f through an inverter I (representatively indicating I10 to I1i).

Switch element TG3 is turned on when a potential of "H" is supplied to control terminal C1 and a potential of "L" is supplied to control terminal C2. Switch element TG3 is turned off when a potential of "L" is supplied to control terminal C1 and a potential of "H" is supplied to control terminal C2.

The manner in which switch elements TG3p1 and TG3p2 connect main column select line Y and sub column select line a (b; c; d) is the same as that of the shift redundancy circuit shown in FIG. 8. Switch element TG3 is capable of transmitting a signal without loss in signal potential and disconnecting reliably main column select line Y and the sub column select line a (b; c; d) in the off state.

The method of repairing a defective bit employing the shift redundancy circuit of FIG. 15 is the same as that when the shift redundancy circuit of FIG. 8 is employed.

Figure 16:
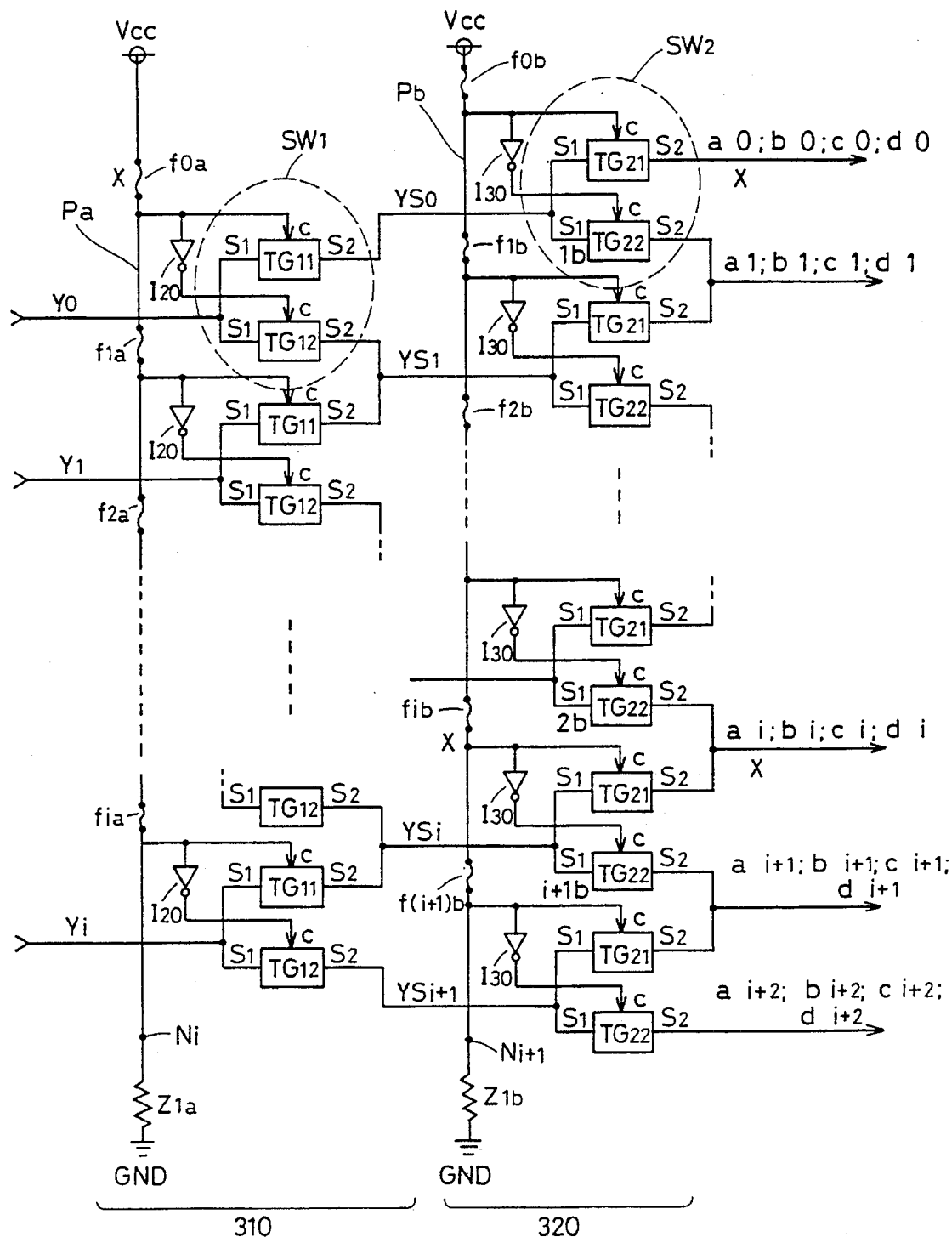
FIG. 16 shows another structure of the shift redundancy circuit.

FIG. 16 shows still another structure of the shift redundancy circuit. The shift redundancy circuit shown in FIG. 16 is capable of repairing two columns in one block.

In FIG. 16, a shift redundancy circuit 300 includes a first sub redundancy circuit 310 and a second sub redundancy circuit 320. First sub redundancy circuit 310 includes a switch circuit SW1 for connecting one main column select line Y to one of two adjacent sublines YS in an alternative way and a potential supply path Pa for setting a connection path of switch circuit SW1.

The switch circuit SW1 includes switch elements TG11 and TG12 turning on and off complementarily. Switch elements TG11, TG12 have the same function as those of switch elements TG01 to TGi1 shown in FIGS. 8, 10, 11, 12 and 13. The output of an inverter I20 is supplied to a control terminal C of the switch element TG12 so as to cause switch elements TG11 and TG12 to operate complementarily. The output of inverter I20 and the control input C of the corresponding switch element TG11 are commonly connected to a lower node of the same fuse element f.

The potential supply path $P_a$ includes (i+1) fuse elements $f_{)a}$ to $f_{ia}$ connected in series between the voltage source $V_{cc}$ and the node $N_i$ and a resistor Z1a having a high resistance connected between the node $N_i$ and the ground GND.

Switch element TG11 connects a corresponding main column select line Y (for example $Y_m$) to a corresponding subline YS (for example $YS_m$). Switch element TG12 connects a corresponding main column select line Y (for example $Y_m$) to an adjacent subline YS (for example $YS_{m+1}$).

Second sub redundancy circuit 320 includes a switch circuit SW2 provided corresponding to each of sublines $YS_0$ to $YS_{i+1}$, and a potential supply path $P_b$ for setting a connection path of switch circuit SW2.

Switch circuit SW2 includes switch elements TG21 and TG22 turning on and off complementarily. Switch elements TG21 and TG22 have the same structures as those of switch elements TG11 and TG12. Switch element TG21 connects a related subline YS (for example $YS_m$) to a corresponding sub column select line a (for example $a_m$). Switch element TG22 connects a related subline YS (for example $YS_m$) to an adjacent sub column select line a (for example $a_{m+1}$). In each of blocks A to D, (i+2) sub column select lines a are provided for i main column select lines YS.

The potential supply path $P_b$ includes (i+2) fuse elements $f_{0b}$ to $f_{(i+1)b}$ connected in series between the voltage source $V_{cc}$ and the node $N_{i+1}$ and a resistor Z1b having a high resistance connected between the node $N_{i+1}$ and the ground GND. The operation of repairing a defective bit will be described below.

Suppose that sub column select lines $a_0$ and $a_i$ correspond to defective columns. Firstly, a fuse element $f_{0a}$ (potential supply path $P_a$) corresponding to main column select line $Y_0$ is blown off in order to disconnect sub column select line $a_0$. The control voltage from potential supply path $P_a$ attains "L", switch element TG11 is turned off, and switch element TG12 is turned on. Main column select lines $Y_0$ to $Y_i$ are connected to the sublines $YS_1$ to $YS_{i+1}$, respectively. Subline $YS_0$ is disconnected. In this state, sublines $YS_1$ to $YS_{i+1}$ are connected to column select lines $a_1$ to $a_{i+1}$ through switch element TG21, respectively. Repairing of the defective column (sub column select line) $a_0$ is completed.

Subsequently repairing of the defective column $a_i$ is carried out. In potential supply path $P_b$, a fuse element fib corresponding to sub column select line $a_i$ is blown off. Sublines $YS_1$ to $YS_{(i-1)}$ are connected to sub column select lines $a_1$ to $a_{(i-1)}$ through switch element TG21. Sublines $YS_i$ to $YS_{(i+1)}$ are connected to sub column select lines $a_{i+1}$ to $a_{i+a}$. Sub column select line $a_i$ is disconnected and repairing of the defective column $a_i$ is completed.

Generally, if there are two defective columns at, (r<s), firstly, a fuse element $f_r$ associated with main column select line $Y_r$ corresponding to column $a_r$ is blown off in the potential supply path $P_a$. As a result, a corresponding subline $YS_r$ is disconnected. Main column select lines $Y_0$ to $Y_{r-1}$ are connected to sublines $YS_0$ to $YS_{r-1}$ through switch element TG11, and main column select lines $Y_r$ to $Y_i$ are connected to sublines $YS_{r+1}$ to $YS_{i+1}$ through switch element TG12. Subsequently a fuse element $f_s$ associated with subline $YS_s$, corresponding to the defective column $a_s$ is blown off in the potential supply path $P_b$. Sublines $YS_0$ to $YS_{i+1}$ are connected to sub column select lines $a_0$ to $a_{s-1}$ through switch element TG21 and sublines $YS_s$ to $a_{i+2}$ are connected to sub column select lines $a_{s+1}$ to $a_{i+2}$ through switch element TG22. Though the subline $Y_r$ is connected to the defective sub column select line $a_r$, subline $Y_r$ is disconnected from main column select line Y.

As a result, main column select lines $Y_0$ to $Y_{r-1}$ are connected to sub column select lines $a_0$ to $a_{r-1}$, main column select lines $Y_r$ to $Y_{s-2}$ are connected to sub column select lines $a_{r+1}$ to $a_{s-1}$, and main column select lines $Y_{s-1}$ to $Y_i$ are connected to sub column select lines $Y_{s+1}$ to $Y_{i+2}$, respectively.

While two columns can be repaired in the structure shown in FIG. 16, if this structure is continuously connected and expanded to have three or more cascaded stages, three or more defective columns can be repaired.

Figure 17:
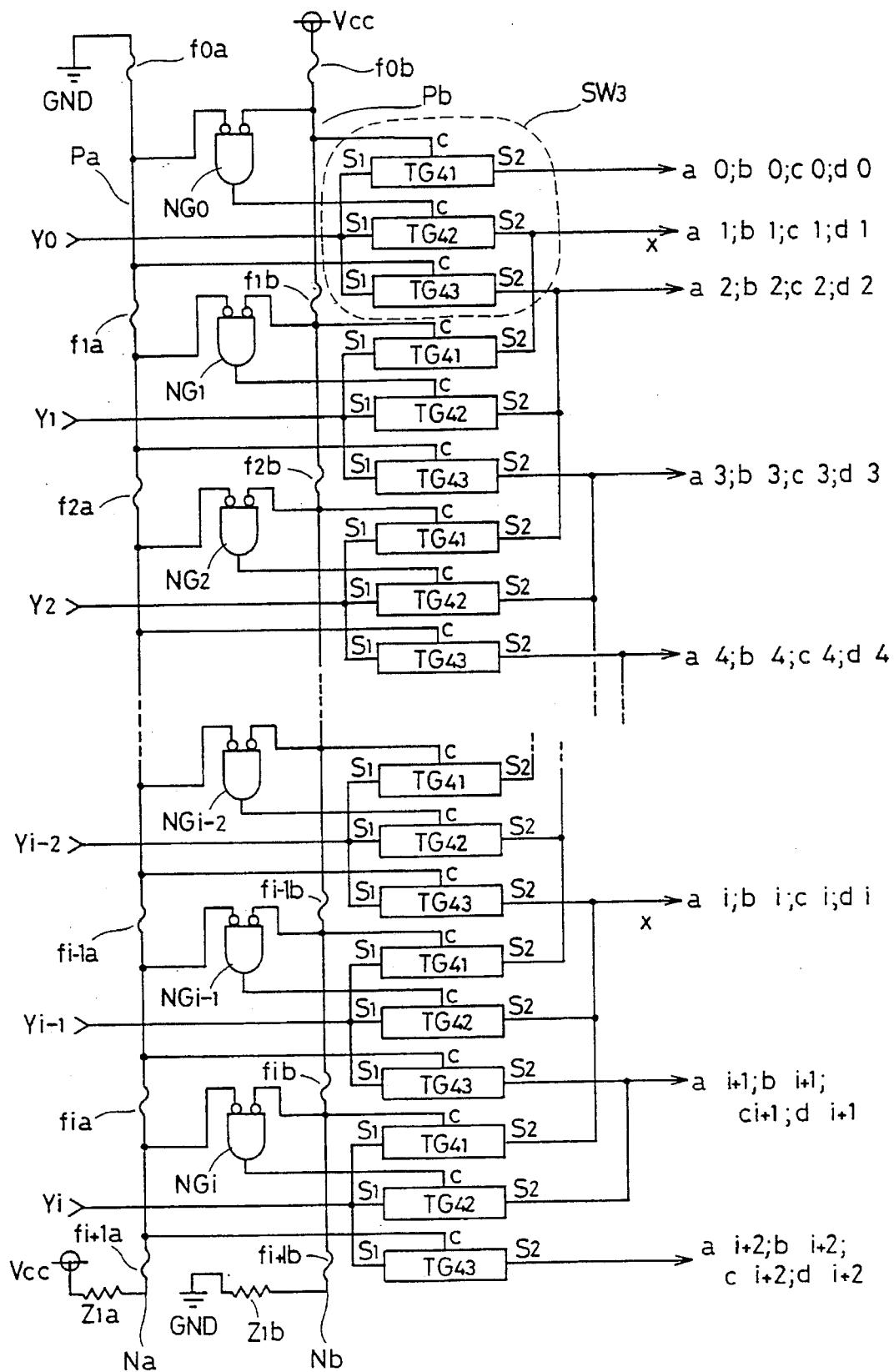
FIG. 17 shows another structure of the shift redundancy circuit.

FIG. 17 is a diagram showing still another structure of the shift redundancy circuit. The shift redundancy circuit of FIG. 17 is capable of repairing two columns. In FIG. 17, the shift redundancy circuit includes a switch circuit SW3 provided corresponding to each of main column select lines $Y_0$ to $Y_i$, potential supply paths $P_a$ and $P_b$ for setting a connection path of the switch circuit SW3, and a NOR gate NG ($NG_0$ to $NG_i$) provided corresponding to each of the switch circuits SW3.

Potential supply path $P_a$ includes fuse elements $f_0$ to $f_{(i+1)}$ a connected in series between the ground GND and a node $N_a$ and a resistor Z1a having a high resistance provided between the node $N_a$ and the voltage source $V_{cc}$.

Potential supply path $P_b$ includes fuse elements $f_{ob}$ to $f_{(i+1)b}$ connected in series between voltage source $V_{cc}$ and a node $N_b$ and a resistor Z1b having a high resistance connected between the node $N_b$ and the ground GND.

NOR gates $NG_o$ to $NG_i$ are provided corresponding to main column select lines $Y_0$ to $Y_i$. NOR gate $NH_m$ (m=0 to i) receives the potential of a lower node of fuse element $f_{ma}$ (a node closer to the node $N_a$ in the figure) and the potential of a lower node of fuse element $f_{mb}$ (a node closer to the node $N_b$). Each of NOR gates $NG_0$ to $NG_i$ supplies a signal of "H" only when the both inputs are at "K".

Switch circuit SW3 includes three switch elements TG41, TG42 and TG43 connected in parallel to the associated main column select line Y. Switch elements TG41, TG42 and TG43 function in the same manner as that of switch elements TG1 or TG2 stated above. Switch elements TG41 to TG43 each include a terminal S1 connected to main column select line Y, a terminal S2 connected to a sub column select line a (b; c; d) and a control signal input terminal (control terminal) C, respectively.

Switch element TG41 receives the potential of the lower node of a corresponding fuse element among fuse elements $f_{ob}$ to $f_{ib}$ of potential supply path $P_b$ at control terminal C. Switch element TG42 receives the output of a corresponding one among the NOR gates $NG_0$ to $NG_i$ at control terminal C. Switch element TG43 receives the potential of the lower node of a corresponding fuse element among fuse elements $f_{oa}$ to $f_{ia}$ of potential supply path $P_a$ at control terminal C.

Switch element TG41 connects main column select line Y to sub column select line a (b; c; d) without shifting in connection. Switch element TG42 connects main column select line Y to sub column select line a (b; c; d) by shifting the select line Y by one column. Switch element TG43 connects main column select line Y to the sub column select line a (b; c; d) by shifting the select line Y by two columns.

When there is no defective bit in the block (A to D), fuse elements $f_{(i+a)\ a}$ and $f_{(i+b)b}$ are blown off, cutting of the current flow path of potential supply paths $P_a$ and $P_b$. The operation thereof will now be described.

When there is no defective bit in the corresponding block (A to D), fuse elements $f_{(i+1)\ a}$ and $f_{(i+1)b}$ are blown off. The potentials of the lower nodes of fuse elements $f_{oa}$ to $f_{ia}$ attain "L", the potentials of the lower nodes of fuse elements $f_{ob}$ to $f_{ib}$ attain "H", and the outputs of NOR gates $NG_0$ to $NG_i$ attain "L". Switch element TG41 is turned on, switch elements TG42, TG43 are turned off, and main column select lines $Y_0$ to $Y_i$ are connected to sub column select lines $a_0$ to $a_i$ ($b_0$ to $b_i$; $c_0$ to $c_i$; $d_0$ to $d_i$), respectively.

Now, let us assume that sub column select line $a_i$ is connected to a defective column. At this time, fuse element $f_{ib}$ corresponding to the main column select line $Y_1$ is blown off. The potentials of the lower nodes of the fuse elements $f_{1b}$ to $f_{ib}$ attain "L" and the outputs of the NOR gates $NG_1$ to $NG_i$ rise to "H". In switch circuits SW3 corresponding to main column select lines $Y_1$ to $Y_i$, switch element TG42 is turned on and switch elements TG41 and TG43 are turned off. Main column select lines $Y_1$ to $Y_i$ are connected to sub column select lines $a_1$ to $a_{i+1}$ ($b_1$ to $b_{i+1}$; $c_1$ to $c_{i+1}$; $d_1$ to $d_{i+1}$), respectively. Main column select line $Y_0$ is connected to sub column select line $a_0$ ($b_o$; $c_o$; $d_0$), so that repairing of one column is completed.

Furthermore, let us assume that a defective column is connected to sub column select line $a_i$ ($b_i$; $c_i$; $d_i$). Sub column select line $a_i$ is connected to main column select line $Y_{i+1}$. A fuse element $f_{(i-1)a}$ corresponding to main column select line $Y_{i-1}$ is blown off. The potentials of the lower nodes of fuse elements $f_{(i-1)a}$ and $f_{ia}$ attain "H", and the outputs of NOR gates $NG_{i-1}$ and $NG_i$ attain "L". Main column select lines $Y_{i-1}$ and $Y_i$ are connected to sub column select lines $a_{i+1}$ and $a_{i+2}$ through switch element TG43, respectively.

Generally, when defective columns correspond to sub column select lines $a_p$, $a_q$ (p<q), a fuse element $f_{pb}$ (corresponding to a main column select line $Y_p$) of potential supply path $P_b$ is blown off and then a fuse element $f_{(q-1)\,a}$ (corresponding to a main column select line $Y_{(q-1)}$) of potential supply path $P_a$ is blown off. Repairing at maximum of two defective columns can be effected by selectively blowing off the fuse elements.

If still more switch elements are provided in switch circuit SW3 so that only one switch element is turned on in switch circuit SW3, still more defective columns can be repaired.

The shift redundancy circuit shown in FIG. 17 may be used in combination with the shift redundancy circuits shown in FIGS. 8 to 16. A specific structure of switch elements used in a shift redundancy circuit will now be described.

Figure 18A:
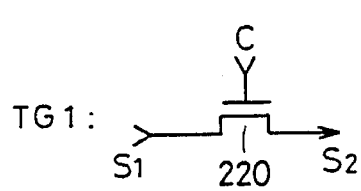
FIGS. 18(A–B) show a specific structure of a switch element employed in the shift redundancy circuit.

FIG. 18A shows an example of a specific structure of a switch element TG1. Switch element TG1 represents switch elements TG01 to TGi1 shown in FIGS. 8 and 10 to 14, switch elements TG11, TG21 shown in FIG. 16, and switch elements TG41, TG42 and TG43 shown in FIG. 17.

Switch element TG1 includes an n channel MOS (insulated gate type) transistor 220 having one conduction terminal connected to an input terminal S1, another conduction terminal connected to an output terminal S2, and the gate connected to a control terminal C. When a signal of "H" is applied to control terminal C, transistor 220 is turned on, and when a signal of "L" is applied thereto, it is turned off.

Figure 18B:
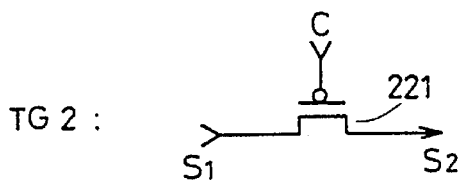

A specific structure of a switch element TG2 is shown in FIG. 18B. Switch element TG2 represents switch elements TG02 to TGi2 shown in FIGS. 8 and 10 to 14 and switch elements TG12, TG22 shown in FIG. 16. Switch element TG2 includes a p channel MOS transistor 221 having one conduction terminal connected to an input terminal S1, another conduction terminal connected to an output terminal S2, and a gate electrode connected to a control terminal C. Transistor 221 is turned off when a signal of "H" is supplied to control terminal C, and it is turned on when a signal of "L" is supplied thereto.

Figure 19:
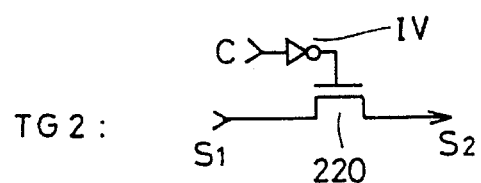
FIG. 19 shows a modified example of the second switch element shown in FIG. 18.

FIG. 19 shows another structure of switch element TG2. Switch element TG2 shown in FIG. 19 includes an inverter IV for inverting a signal supplied to a control terminal C and an n channel MOS transistor 220 having one conduction terminal connected to an input terminal S1, another conduction terminal connected to an output terminal S2, and the gate connected to the output of inverter IV. Switch element TG2 shown in FIG. 19 operates in the same way as switch element TG2 shown in FIG. 18B.

Figure 20:
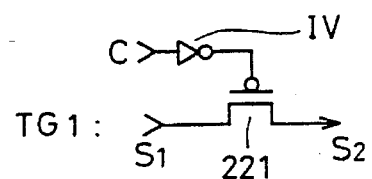
FIG. 20 shows a modified example of the first switch element shown in FIG. 18.

FIG. 20 shows another structure of switch element TG1. Switch element TG1 shown in FIG. 20 includes an inverter IV for inverting a signal supplied to a control terminal C and a p channel MOS transistor 221 having one conduction terminal connected to an input terminal S1, another conduction terminal connected to an output terminal S2, and the gate connected to the output of inverter IV. Switch element TG1 shown in FIG. 20 operates in the same way as switch element TG1 shown in FIG. 18A. An arbitrary combination of switch elements TG1, TG2 shown in FIGS. 18A to 20 may be employed.

Figure 21:
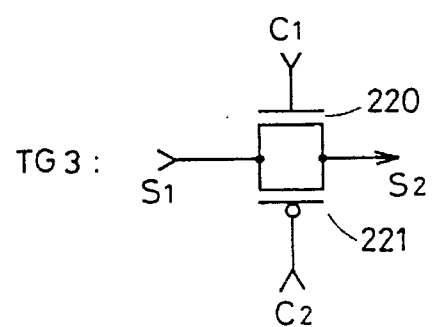
FIG. 21 shows another structure of a switch element employed in the shift redundancy circuit.

FIG. 21 shows a specific structure of a switch element TG3. Switch element TG3 represents switch elements TG301, TG302 to TG3i1, TG3i2 shown in FIG. 15. Switch element TG3 includes an n channel MOS transistor 220 and a p channel MOS transistor 221 connected in parallel between an input terminal S1 and an output terminal S2. The gate of transistor 220 is connected to one control terminal C1 and the gate of transistor 221 is connected to another control terminal C2. If the connection arrangement of this switch element TG3 is such that it operates in the same manner as switch elements TG1 and TG2, it may be used in place of switch elements TG1 and TG2.

Figure 22:
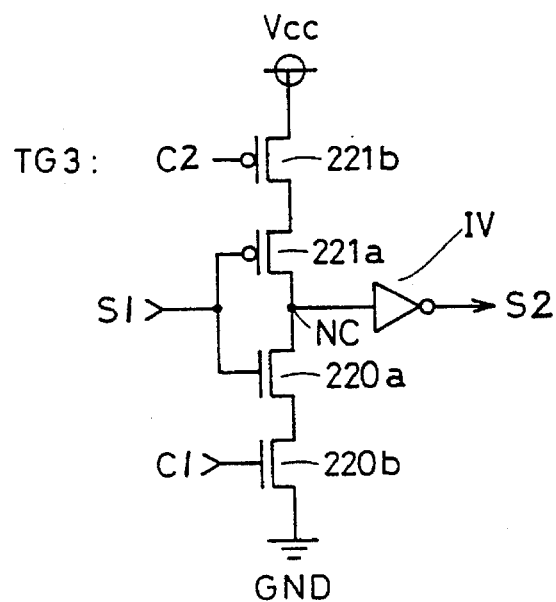
FIG. 22 shows a modified example of the switch element shown in FIG. 21.

FIG. 22 shows another structure of switch element TG3. In FIG. 22, switch element TG3 includes a p channel MOS transistor 221a and an n channel MOS transistor 220a complementarily connected between an input terminal S1 and a node NC, a p channel MOS transistor 221b connected between transistor 221a and the voltage source $V_{cc}$, an n channel MOS transistor 220b connected between transistor 220a and the ground GND and an inverter IV connected between the node NC and an output terminal S2. The gate of transistor 220b is connected to one control terminal C1. The gate of transistor 221b is connected to the other control terminal C2. Transistors 220a, 220b, 221a and 221b provide a function of a clocked inverter. When a potential of "H" is applied to terminal C1 and a potential of "L" is applied to the terminal C2, an inverted potential of the potential of terminal S1 appears at the node NC. The potential of the node NC is inverted by inverter IV.

It is unnecessary to provide inverter IV in every switch element TG3. If terminal S2 is connected to a sub column select line, an inverter is provided in each sub column select line and switch element TG3 may be structured only by transistors 220a, 220b, 221a and 221b.

Figure 23:
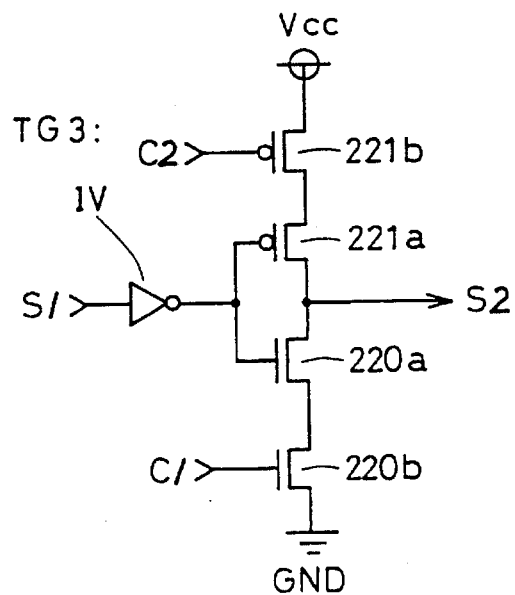
FIG. 23 shows another modified example of the switch element shown in FIG. 21.

FIG. 23 shows still another structure of switch element TG3. Switch element TG3 shown in FIG. 23 is different from switch element TG3 shown in FIG. 22 in that an inverter IV is provided between an input terminal S1 and the gates of transistors 221a and 220a. If input terminal S1 is connected to a main column select line, the inverter may be provided in the main column select line and switch element TG3 may be structured only by transistors TG220a, 220b, 221a and 221b. That is, inverter IV may be shared by switch elements TG3 associated with the same main column select line.

While the connection path of the main column select line and the sub column select line is set by blowing off fuse elements f in potential supply paths P, $P_a$ and $P_b$, a non volatile storage device may be used in place of the fuse elements. This non volatile storage device is normally turned on and it is turned off at the time of programming.

Figure 24:
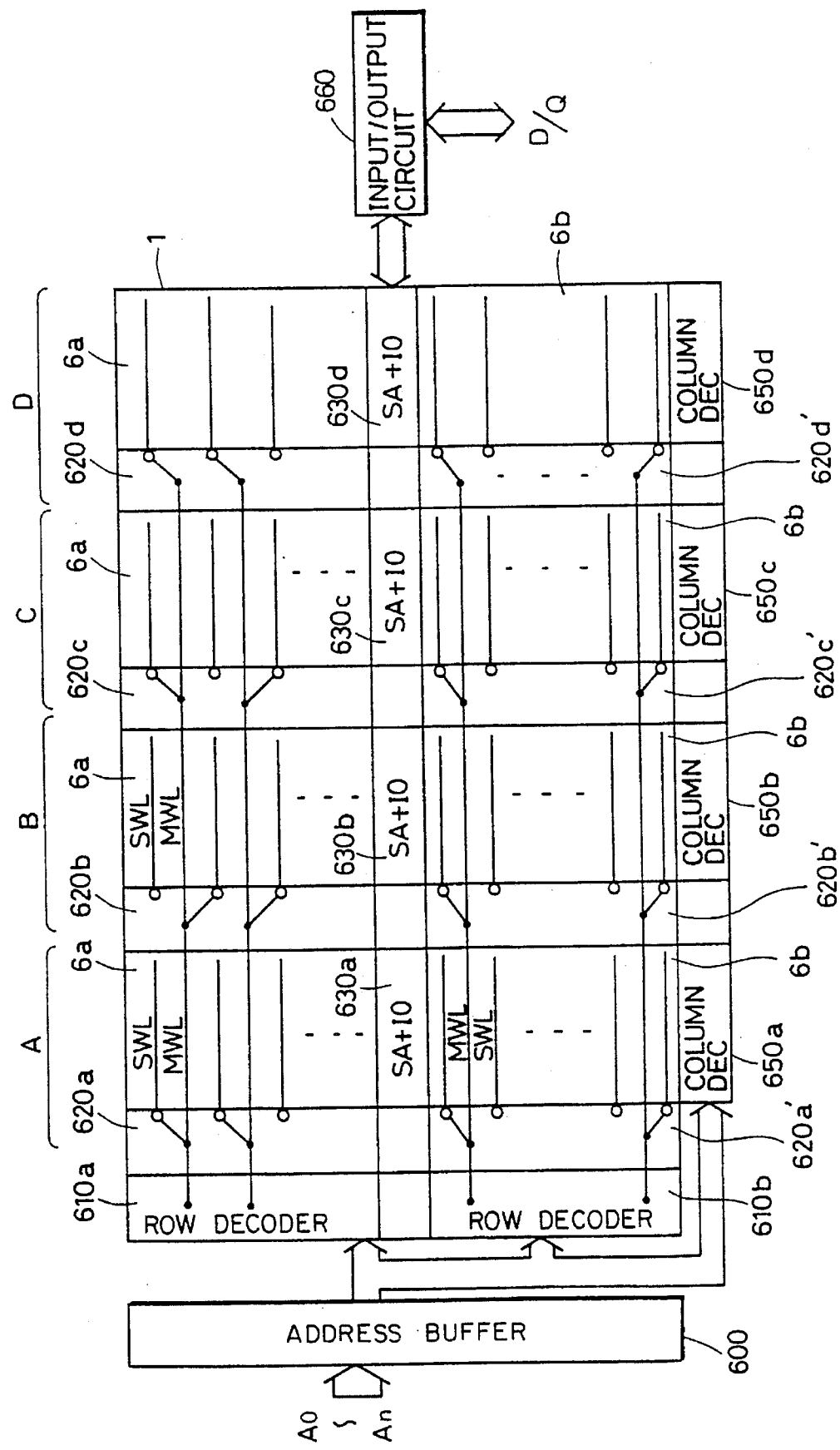
FIG. 24 schematically shows an overall structure of a semiconductor memory device in accordance with another embodiment of the present invention.

FIG. 24 shows an overall structure of a semiconductor memory device in accordance with another embodiment of the present invention. In FIG. 24, the semiconductor memory device includes a memory cell array 1 including a plurality of memory cells and an address buffer 600 for generating an internal row address signal and an internal column address signal in accordance with externally applied address signals $A_0$ to $A_n$.

Memory cell array 1 is divided into four blocks A to D and blocks A to D each includes two subarrays 6a and 6b. Each of subarrays 6a, 6b includes memory cells arranged in rows and columns. In each of subarrays 6a, 6b, one row of memory cells are connected to a subword line (sub row select line) SWL. One column is connected to a column line.

A row decoder 610a is provided for subarrays 6a of blocks A to D and a row decoder 610b is provided for subarrays 6b of blocks A to D. The internal row address signal is transmitted to row decoders 610a, 610b from address buffer 600.

The row select signals (word line driving signals) from row decoders 610a, 610b are transmitted on main word lines MWL provided corresponding to each output of decoders 610a, 610b. Main word lines MWL extend over blocks A to D, so as to be shared by blocks A to D.

Shift redundancy circuits 620a to 620d are provided for blocks A to D, respectively, in order to connect main word lines MWL and the subword lines in each of blocks A to D. Shift redundancy circuits 620a to 620d have the same structures as those of shift redundancy circuits 300a to 300d previously described in conjunction with repairing of a defective column. Accordingly, subarrays 6a and 6b both include more subword lines than main word lines MWL provided for one row decoder 610 (610a, 610b) by one or more.

(Sense amplifier+I/O) blocks 630a to 630d are provided between subarrays 6a and subarrays 6b of blocks A to D. Blocks 630a to 630d have the same structures as those of (sense amplifier+I/O) blocks 2a to 2d shown in FIG. 6.

Column decoders 650a to 650d are provided for blocks A to D, respectively. Column decoders 650a to 650d decode an internal column address signal from address buffer 600 to generate a column select signal. A memory cell of 1 bit is selected from each of blocks A to D and memory cells of 4 bits are connected to an input/output circuit 660.

In operation, only subarrays including word lines selected by the outputs of row decoders 610a, 610b (rows in the subarrays) are connected to the sense amplifiers in blocks 630a to 630d.

In the structure of FIG. 24, too, the word lines are divided into main word lines MWL and subword lines SWL and the connection between main word lines MWL and the subword lines SWL is set by the switch circuits in shift redundancy circuits 620a to 620d, so that repairing of a defective row can be effected independently in each block A to D.

While a DRAM is employed as the semiconductor memory device in the above-mentioned embodiment, it may be an SRAM (Static Random Access Memory), or a Read Only Memory. Generally, it may be a semiconductor memory of a block dividing scheme, including a plurality of memory cells arranged in rows and columns.

While writing and reading of data is carried out through the same I/O line pair in the embodiment above, an I/O line pair for data writing and an I/O line pair for data reading may be separately provided.

Furthermore, the number of divided block is not limited to 4 and may be other number such as 8, 16 and so on. It may be a memory of a block dividing scheme without a shared sense amplifier structure.

The technical advantages of the present invention are as follows.

A memory test such as row simultaneous writing and a line mode test can be realized, in which a plurality of column select lines are simultaneously selected.

In a redundancy circuit, it is not necessary to provide an I/O line switch or a switch circuit for separating a column decoder, and a fuse program circuit for detecting a coincidence/non-coincidence of an address signal and a defective address, saving the area of the layout.

As a main column or row select line and a sub column or row select line can be directly connected together, an access delay therein can be made minimum. Furthermore, since repairing of a defective bit can be carried out independently for each block of the memory cell array divided into blocks, repairing efficiency is enhanced.

There is no need for a spare I/O line pair and a spare column select signal, so that a waste of power can be reduced. Moreover, the number of fuse elements required to be blown off is the same as the number of defective columns or rows in each blocks, and smaller than that of fuses to be programmed shown in the conventional example, so that repairing of a defective bit is more easily effected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A defective bit repairing circuit in a semiconductor memory device including a plurality of memory blocks, each memory block including a plurality of memory cells arranged in a matrix of rows and columns, comprising:

i main row or column lines each commonly extending over said plurality of memory blocks to be shared therewith, where i is an integer;

decoder means having i outputs and responsive to a received address signal for selecting a main row or column line out of said i main row or column lines through an output thereof;

at least (i+1) sub row or column lines in each of said plurality of memory blocks, each sub row or column line for selecting a row or column of memory cells in an associated memory block;

a plurality of connecting means coupled, respectively, to said plurality of memory blocks, each connecting means coupled between said i main row or column lines and said at least (i+1) sub row or column lines in an associated memory block for selectively connecting one main row or column line to one of a predetermined set of lines of said at least (i+1) sub row or column lines; and a plurality of defining means coupled, respectively, to said plurality of memory blocks, each defining means coupled to each connecting means of each memory block for defining a manner of an associated connecting means such that said i main row or column lines are connected to successively adjacent sub row or column lines in one to one correspondence except a sub row or column line including a defective bit.

2. A defective bit repairing circuit according to claim 1, wherein each said defining means comprises means for defining a manner of connection of the associated connecting means by grouping, if there is a defective sub row or column line related to a defective bit, the main row or column lines into a first group including a main row or column line connected to the defective row or column line and a second group including remaining main row or column lines, and switching from the defective sub row or column line respective sub row or column lines of only the first group to be connected to respective sub row or column lines, said first and second groups both including successively adjacent main row or column lines.

3. A defective bit repairing circuit according to claim 2, wherein each said defining means comprises at least one potential supplying path connected between a first potential source and a second potential source, said at least one potential supplying path including at least i fusible elements connected in series.

4. A defective bit repairing circuit according to claim 3, wherein said at least one potential supplying path is coupled to one of said first and second potential source through a relatively high resistance.

5. A defective bit repairing circuit according to claim 3, wherein said at least one potential supplying path comprises means responsive to a memory cycle defining signal for coupling one end of said at least one potential supplying path to one of said first and second potential source, and means for latching potential of said one end of said at least potential supplying path.

6. A defective bit repairing circuit according to claim 3, wherein said sub row or column lines comprises (i+1) sub row or column lines;

each connecting means includes a plurality of switching means, each having an identical structure and provided corresponding to each of said main row or column lines, for selectively connecting an associated main row or column line to one of two adjacent sub row or column lines;

if there is a defective bit, each defining means defining said switching means into two sets corresponding to two sets of successively adjacent main row or column lines in relation to a main row or column line corresponding to the sub row or column line including the defective bit, said defining means setting each path of connection of said switching means such that a path of connection of the switching means belonging to one set of the two sets is different from a path of connection of the switching means belonging to the other set;

each said switching means comprises a pair of switching elements consisting of first and second switching elements turning on and off complementary to each other, each of said first and second switching elements having first and second control terminals receiving complementary control signals;

a k-th fusible element in said i fusible elements has one end connected to a first control terminal of the first switching elements of the switching means corresponding to a k-th main row or column line and to a second control terminal of the second switching element, said one end of said k-th fusible element connected through an inverter to a second control terminal of said first switching element and to a fist control terminal of said second switching element.

7. A defective bit repairing circuit according to claim 1, wherein each said memory block comprises (n+1) sub row or column lines, each connecting means including a plurality of switching means, each having an identical structure and coupled to corresponding each of said i main row or column lines, for selectively connecting an associated main row or column line to one of two adjacent sub row or column lines, and if there is a defective bit, each defining means defining said switching means into two sets corresponding to two sets of successively adjacent main row or column lines in relation to a main row or column line corresponding to the sub row or column line associated with the defective bit, said defining means setting each path of connection of said switching means such that a path of connection of the switching means contained in one set of the two sets is different from a path of connection to the switching means contained in the other set.

8. A defective bit repairing circuit according to claim 6, wherein each switching means comprises a pair of switching elements which are turned on and off complementary to each other;

each defining means comprises a potential supplying path coupled between a first potential source and a second potential source, said potential supplying path including i fusible elements connected in series corresponding to respective main row or column lines;

said pair of switching elements has a first switching element and a second switching element;

each of said i fusible elements has an end connected to control terminals of said first and second switching elements; and the first switching element of one of said plurality of switching means and the second switching element of another one of said plurality switching means, adjacent to said one of said plurality of switching means, are connected to identical sub row or column lines.

9. A defective bit repairing circuit according to claim 1, wherein said sub row or column lines comprises at least (i+2) row or column lines;

each said connecting means comprises (i+1) subsignal lines, first selecting means arranged between said i main row or column lines and said (i+1) subsignal lines, said first selecting means including a plurality of first connecting means provided corresponding to each of said i main row or column lines for selectively connecting a corresponding main row or column line to one of two successive adjacent subsignal lines, first defining means for defining a manner of connection of said plurality of first connecting means, second selecting means arranged between said subsignal lines and said plurality of sub row or column lines, said second selecting means including a plurality of second connecting means provided corresponding to each of said subsignal line for selectively connecting a corresponding subsignal line to one of two successive adjacent sub row or column lines, and second defining means for defining a manner of connection of said plurality of second connecting means;

said first defining means comprises means for changing the manner of connection of said plurality of first connecting means, when a first sub row or column line is associated with a defective bit, in successively adjacent main row or column lines in a first set including a main row or column line corresponding to said first sub row or column line from that in remaining successively adjacent main row or column line of a second set, said plurality of first connecting means being grouped into first and second sets corresponding to the first and second sets of said i main row or column lines; and said second defining means includes means for defining the manner of connection of said plurality of second connecting means such that, when a second sub row or column line is associated with a defective bit in an associated memory block, the manner of connection differs in a first set and in a second set of said plurality of second connecting means, each set having one connecting means connected to said second sub row or column line, the manner of connection of the first set of said plurality of first connecting means being identical to that in the first set of said plurality of second connecting means, the manner of connection of the second set of said plurality of first connecting means being identical to that of the second set of said plurality of second connecting means;

whereby said i main row or column lines are connected in one to one correspondence to successively adjacent i sub row or column lines except said first and second sub row or column lines.

10. A defective bit repairing circuit according to claim 1, wherein at least (i+1) sub row or column lines include (i+m) sub row or column lines, where m is an integer, each said connecting means includes first to M-th cascade connected selecting means, a k-th selecting means in said connecting means includes, where k is an integer satisfying 1≦k≦M, and M≦m, (i+k) subsignal lines, selecting means having a plurality of connecting circuit means provided corresponding to each of a (i+k−1)-th subsignal line of said (i+k) subsignal lines of a (k−1)-th selecting means of said connecting means for connecting a corresponding subsignal line of said (k−1)-th selecting means selectively to one of adjacent two subsignal lines of said (i+k) subsignal lines, and defining means for defining a manner of connection of said selecting circuit means;

said defining means comprises means for changing the manner of connection, when there are N sub row or column lines including defective bits, in a first set of subsignal lines of the (k−1)-th selecting means including a subsignal line corresponding to a defective sub row or column line from that in a second set of remaining subsignal lines in repairing the defective sub row or column line including a k-th defective sub row or column line in said N sub row or column lines, where N is an integer satisfying N≦K, said first set and said second set including successively adjacent subsignal lines, respectively.

11. A circuit according to claim 1, wherein said sub row or column lines comprises (i+2) sub row or column lines; and wherein each said connecting means comprises a plurality of connecting means provided corresponding to each of said i main row or column lines, each of said connecting means having switching means for selectively connecting a corresponding main row or column line to one of three successively adjacent sub row or column lines;

said means for defining comprises first means for making different a manner of connection of said connecting means, when a sub row or column line related to a defective bit is one first sub row or column line, in a first set of main row or column lines including a main row or column line connected to said first sub row or column line when there is no defective bit, from that of a second set of remaining main row or column lines, whereby said i main row or column lines are connected in one to one correspondence to successively adjacent sub row or column lines except said first sub row or column line, said means for defining further comprises second means for making different the manner of connection of said connecting means, when there is another defective bit for a second sub row or column line connected to a main row or column line included in the first set of said main row or column lines, in a third set of signal lines including a main row or column line corresponding to said second sub row or column line in said first set, from that of a set of remaining main row or column lines in the third set and that of the second set of said main row or column lines, whereby the first set of said main row or column lines are connected in one to one correspondence to the successively adjacent sub row or column lines except said first and second sub row or column lines.

12. A circuit according to claim 1, wherein said sub row or column lines comprise (i+2) row or column lines;

each said connecting means comprises a plurality of connecting means provided corresponding to each of said main row or column lines, each of said connecting means including switching means for connecting the corresponding main row or column line to successively adjacent three sub row or column lines, said switching means having first, second and third switching elements connected to different sub row or column lines;

said defining means comprises first defining means provided common to said plurality of connecting means for defining on and off state of said first switching element, said first defining means having a first path for supplying a first potential, second defining means provided common to said plurality of connecting means for defining on and off state of said second switching element, said second defining means having a second path for supplying a second potential which is of opposite polarity to said first potential, and third defining means provided common to said plurality of connecting means for defining on and of sate of said third switching element, said third defining means including gate means provided for each said third switching element, responsive to the potential on said first path and the potential on said second path for defining on and off of the corresponding third switching element, said gate means generating a signal of an active level only when the potential on said first path and the potential on said second path are both at inactive level to the corresponding third switching element, whereby only one switching element is turned on in one connecting means.

13. A circuit according to claim 12, wherein said first path comprises one end connected to the first potential, another end coupled to receive the second potential, and i series connected first fusible elements provided corresponding to each of said i main row or column lines;

said second path comprises one end connected to said second potential source, another end coupled to receive said first potential source, and i second fusible element provided corresponding to each said i main row or column lines;

said gate means comprises a gate receiving potential on one end of a corresponding first fusible element and a potential on one end of a corresponding second fusible element for providing an active level signal only when received input potentials are both at an inactive level.

14. A defective bit repairing circuit according to claim 1, wherein each connecting means comprises a plurality of i to (i+1) switching means for connecting said i main row or column lines to predetermined i sub row or column lines in accordance with said defining means such that the time for accessing any one of said plurality of memory blocks remains substantially constant.

15. A method for repairing a defective bit in a semiconductor memory device including a plurality of memory blocks, i main row select lines commonly extending over a plurality of memory blocks to be shared therewith, k main column select lines extending over a plurality of memory blocks, row decoder means responsive to a received address signal for selecting a main row select line out of said i main row select lines, and a column decoder means responsive to a received address signal for selecting a main column select line out of said k main column select lines, each said memory block including a plurality of memory cells arranged in a matrix of at least (i+1) rows and at least (k+1) columns, at least (i+1) sub word lines each connecting one row of memory cells and at least (k+1) sub column select lines each selecting one column of memory cells, said method comprising the steps of:

in each said memory blocks, connecting said i main row select lines to successively adjacent i sub word lines of said at least (i+1) sub word lines in one to one correspondence when no defective memory cell is connected to said successively adjacent i sub word lines;

connecting said k main column select lines in one to one correspondence to successively adjacent k column lines of said at least (k+1) sub column select lines when no defective memory cell is connected to said successively adjacent k sub column lines;

if a defective memory cell is connected to a sub word line in said at least (i+1) sub word lines, connecting said i main row select lines respectively to i sub word lines successively adjacent to each other excluding the sub word line having connected thereto the defective memory cell in said at least (i+1) sub word lines, and if a defective memory cell is connected to a sub column select line in said at least (k+1) sub column select lines, connecting said k main column select lines respectively to k sub column select lines successively adjacent to each other excluding the sub column select line having connected thereto the defective memory cell in said at least (k+1) sub column select lines.

16. A method for repairing a defective memory cell in a semiconductor memory device including a plurality of memory blocks, i main word lines commonly extending over said plurality of memory blocks to be shared therewith, row decoder means responsive to a received address signal for selecting a main word lines out of said i main word lines, each said memory blocks including a plurality of memory cells arranged in a matrix of at least (i+1) rows and columns, and at least (i+1) sub word lines for selecting one row of memory cells of the matrix, said memory device further comprising a plurality of connecting means provided for each said memory block and for respective said i main word lines, each for selectively connecting through a switching element a main word line to one sub word line of a predetermined set of sub word lines in said at least (i+1) sub word lines in an associated memory block, and means provided for each said memory block, for defining a manner of connection of each said plurality of connecting means and including i fusible element connected in series between a first potential supply and a second potential supply, each said i fusible element having one end connected to control inputs of switching elements in an associated connecting means, each said i fusible element provided corresponding to said i main word line, said method comprising the steps of:

for each memory blocks, if a defective memory cell is connected to a sub word line, cutting off a fusible element corresponding to a main word line referred to as a defective address line which is connected through switching element to the sub word line connecting thereto the defective memory cell, whereby respective main word lines included in a group of successively adjacent main word lines including said defective address line are shifted by one row to be connected to the sub word line.

17. A method for repairing a defective memory cell in a semiconductor memory device including a plurality of memory blocks, i main column select lines commonly extending over said plurality of memory blocks to be shared therewith, column decoder means responsive to a received address signal for selecting a main column select line out of said i main column select lines, each said memory blocks including a plurality of memory cells arranged in a matrix of at least (i+1) columns and rows, and at least (i+1) sub column select lines for selecting one column of memory cells of the matrix, said memory device further comprising a plurality of connecting means provided for each said memory block and for respective said i main column select lines, each for selectively connecting through a switching element a main column select line to one sub column select line of a predetermined set of sub column select lines in said at least (i+1) sub column select lines in an associated memory block, and means provided for each said memory block, for defining a manner of connection of each said plurality of connecting means and including i fusible element connected in series between a first potential supply and a second potential supply, each said i fusible element having one end connected to control inputs of switching elements in an associated connecting means, each said i fusible element provided corresponding to said i main column select line, said method comprising the steps of:

if a defective memory cell is connected to a sub column select line, cutting off a fusible element corresponding to a main column select line referred to as a defective address line which is connected through switching means to the sub column select line connecting thereto the defective memory cell, whereby respective main column select lines included in a group of successively adjacent main column select lines including said defective address lines are shifted by one column to be connected to the sub column select lines.

18. A semiconductor memory device, comprising:

a plurality of blocks each including (a) a memory cell array including a plurality of memory cells and (b) a plurality of sub memory cell selecting lines each for selecting a first predetermined number n of different memory cells from said memory cell array, said first predetermined number n being greater than or equal to 3;

a plurality of main memory cell selecting lines provided commonly to a second predetermined number m of sub memory cell selecting lines in respective blocks, said second predetermined number m being greater than or equal to 2; and a plurality of switching means provided corresponding to said main memory cell selecting lines in each of said plurality of blocks, each for selectively connecting a corresponding main memory cell selecting line and one of the second predetermined number of sub memory cell selecting lines corresponding to said corresponding main memory cell selecting line in a corresponding block.

19. A semiconductor memory device of claim 18, wherein each switching means comprises m to n switching elements for connecting said m main memory cell selecting lines to n sub memory cell selecting lines such that the time for accessing any one of said plurality of memory blocks remains substantially constant.

20. A semiconductor memory device, comprising:

a plurality of blocks each including (a) a memory cell array having a plurality of memory cells arranged in rows and columns, (b) a plurality of word lines provided corresponding to said rows and each connecting memory cells on a corresponding row, (c) a plurality of bit lines provided corresponding to said columns and each connecting a plurality of memory cells arranged on a corresponding column, and (d) a plurality of sub column select lines provided for said columns for selecting a specified bit line among said bit lines;

a plurality of main column select lines each provided commonly to a predetermined number of sub column select lines in respective blocks, said predetermined number being greater than or equal to 2; and a plurality of switch means provided corresponding to said plurality of main column select lines independently for the respective blocks and each for selectively connecting a corresponding main column select line and one of the predetermined number of sub column select lines corresponding to said corresponding main column select line in a corresponding block.

21. A semiconductor memory device of claim 20, wherein each switching means comprises i to (i+1) switching elements, where i equals the predetermined number of sub column select lines, for connecting said plurality of main column select lines to the predetermined number of sub column select lines such that the time for accessing any one of said plurality of blocks remains substantially constant.

22. A semiconductor memory device, comprising:

a plurality of blocks each including (a) a memory cell array having a plurality of memory cells arranged in rows and columns and divided into a plurality of memory cell array sections by a first predetermined number of rows said first predetermined number being grater than or equal to 2, (b) a plurality of word lines provided corresponding to said rows and each connecting memory cells arranged on a corresponding row, (c) a plurality of bit lines provided in columns independently in respective memory cell array sections and each connecting memory cells arranged on a corresponding column in a corresponding memory cell array section, (d) a plurality of sense amplifiers provided for said columns and each for amplifying a signal appearing on a bit line of a corresponding column in a corresponding memory cell array section, and (e) a plurality of sub column select lines provided for said columns for selecting a bit line of a particular column among said plurality of bit lines in said plurality of memory cell array sections;

a plurality of main column select lines provided commonly to a second predetermined number of sub column select lines among a plurality of sub column select lines in each of said blocks, said second predetermined number being greater than or equal to 2; and a plurality of switch means provided for the main column select lines in the respective blocks and each for connecting a corresponding main column select line and one of the second predetermined number of sub column select lines corresponding to said corresponding main column select line in a corresponding block.

23. A semiconductor memory device of claim 22, wherein each switching means comprises i to (i+1) switching elements, where i equals the second predetermined number of sub column select lines, for connecting said plurality of main column select lines to the predetermined number of sub column select lines such that the time for accessing any one of said plurality of blocks remains substantially constant.

24. A semiconductor memory device, comprising:

a plurality of blocks each including (a) a memory cell array having a plurality of memory cells arranged in rows and columns, (b) a plurality of word lines provided for said rows and each connecting memory cells arranged on a corresponding row, (c) a plurality of bit lines provided for said columns and each connecting memory cells arranged on a corresponding column, (d) a plurality of sub column select lines provided for said columns for selecting a particular bit line among said plurality of bit lines, and (e) a plurality of sense amplifiers provided for said columns and each amplifying a signal appearing on a bit line of a corresponding column;

a plurality of main column select lines each provided commonly to a predetermined number of sub column select lines in said plurality of sub column select line in the respective blocks, said predetermined number being greater than or equal to 2; and a plurality of switch means provided for said plurality of main column select lines independently for each of said blocks and each provided opposing to a sense amplifier on a corresponding column through a bit line of the corresponding column, and each of said switch means for selectively connecting a corresponding main column select line and one of the predetermined number of sub column select lines corresponding to said corresponding main column select line in a corresponding block.

25. A semiconductor memory device of claim 21, wherein each switching means comprises i to (i+1) switching elements, where i equals the predetermined number of sub column select lines, for connecting said plurality of main column select lines to the predetermined number of sub column select lines such that the time for accessing any one of said plurality of blocks remains substantially constant.

26. A semiconductor memory device, comprising:

a plurality of memory blocks each including (a) a memory cell array having a plurality of memory cells, and (b) a plurality of sub memory cell select lines each for selecting a first predetermined number of different memory cells from others in said plurality of memory cells, said first predetermined number being greater than or equal to 2;

a plurality of main memory cell select lines each provided commonly to a second predetermined number of sub memory cell select lines in each of said plurality of memory blocks, said second predetermined number being greater than or equal to 2; and a plurality of switch means provided for said plurality of main memory cell select lines independently for each of said memory blocks, each said switch means connecting a corresponding main memory select line and one of said second predetermined number of sub memory select lines corresponding to said corresponding main memory cell select line in a corresponding memory block;

each of said switch means including a plurality of switch sections provided corresponding to a corresponding main memory cell select line and to the second predetermined number of sub memory select lines in a corresponding memory block, each said switch means being provided between a corresponding sub memory cell select line and a corresponding main memory cell select line and responsive to an applied control potential for being brought into one of a conductive state and a non-conductive state; and control potential apply means provided for each said memory block and each including a potential supply means and a plurality of program means provided in series between a first potential node and a second potential node, for applying a control potential to a switch section in each of the switch means in a corresponding memory block.

27. A memory device according to claim 21, wherein one end of said plurality of program means is connected to the first potential node, and said potential apply means in said control potential apply means includes (a) potential setting means connected to said second potential node and another end of said plurality of program means connected in series and responsive to a control signal for setting a potential at said another end of said plurality of program means connected in series to a potential applied to said second potential node, and (b) latch means for latching the potential at said another end of said plurality of program means connected in series to the potential at the second potential node in response to the potential at said another end of said plurality of program means connected in series.

28. A semiconductor memory device according to claim 26, wherein said plurality of program means is connected in series in said control potential apply means and one end of said plurality of program means is connected to the second potential node, and wherein said potential apply means in said control potential apply means includes (a) potential setting means connected between another end of said plurality of program means connected in series and the first potential node and responsive to a control signal for setting a potential at said another end of said plurality of program means connected in series to a potential applied at said first potential node, and (b) latch means responsive to a potential at said another end of said potential at said another end of said plurality of program means connected in series to a potential applied at said first potential node.

29. A semiconductor memory device of claim 26, wherein each switching means comprises i to (i+1) switching elements, where i equals the predetermined number of sub column select lines, for connecting said plurality of main column select lines to the predetermined number of sub column select lines such that the time for accessing any one of said plurality of blocks remains substantially constant.

* * * * *